United States Patent
Khaled

(10) Patent No.: US 10,128,388 B2
(45) Date of Patent: Nov. 13, 2018

(54) METHODS FOR TREATING A POLYCARBONATE GLASS SURFACE AND FORMING DIRECTED HIERARCHICAL NANOPATTERNING AND INCREASING HYDROPHOBICITY

(71) Applicant: KING FAHD UNIVERSITY OF PETROLEUM AND MINERALS, Dhahran (SA)

(72) Inventor: Mazen Mohammad Khaled, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/344,063

(22) Filed: Nov. 4, 2016

(65) Prior Publication Data

US 2017/0141244 A1    May 18, 2017

Related U.S. Application Data

(60) Provisional application No. 62/256,412, filed on Nov. 17, 2015.

(51) Int. Cl.
*H01L 31/0236* (2006.01)
*B05D 5/08* (2006.01)

(52) U.S. Cl.
CPC .......... *H01L 31/02366* (2013.01); *B05D 5/08* (2013.01)

(58) Field of Classification Search
None
See application file for complete search history.

(56) References Cited

U.S. PATENT DOCUMENTS

| 8,486,319 | B2 | 7/2013 | Victor et al. |
| 2007/0009709 | A1 | 1/2007 | Krishnan et al. |
| 2009/0238986 | A1* | 9/2009 | Gross .................. C09D 183/04 427/458 |
| 2012/0142795 | A1* | 6/2012 | Varanasi .................... C08J 7/02 521/87 |
| 2015/0224539 | A1 | 8/2015 | Lyons et al. |

OTHER PUBLICATIONS

S. Go, M. Han, and Y. Ahn, "Formation of nanoporous polycarbonate surfaces and their chemical modification for superhydrophobicity," Bulletin of the Korean Chemical Society, vol. 33, No. 11, pp. 3899-3902, 2012.*
De Oliveira, F. L. O., et al., Study on bisphenol-A polycarbonates samples crystallized by acetone vapor induction. Polymer bulletin, 2011. 67(6): p. 1045-1057.*

(Continued)

*Primary Examiner* — Nathan T Leong
(74) *Attorney, Agent, or Firm* — Oblon, McClelland, Maier & Neustadt, L.L.P.

(57) ABSTRACT

A method of treating a polycarbonate glass surface, such as a bisphenol A polycarbonate, whereby the glass surface is immersed in a liquid phase polar aprotic solvent, such as dichloromethane, and exposed to a vapor phase polar aprotic solvent, such as acetone thus obtaining a textured glass surface with a hierarchical patterned nanoporous structure wherein the textured glass surface has a higher surface hydrophobicity and a marginally reduced optical light transmittance relative to the polycarbonate glass surface prior to the immersion, the exposure, or both.

15 Claims, 27 Drawing Sheets

(56) References Cited

OTHER PUBLICATIONS

M. Khaled, "Directed Hierarchical Patterning of Polycarbonate Bisphenol A Glass Surface along Predictable Sites" http://www.hindawi.com/journals/jnm/2015/734375/, 2015, pp. 1-6.

Y. Cui, et al., "Hierarchical polymeric textures via solvent-induced phase transformation: A single-step production of large-area superhydrophobic surfaces" https://www.researchgate.net/publication/257378794_Hierarchical_polymeric_textures_via_solvent-induced_phase_transformation_A_single-step_production_of_large-area_superhydrophobic_surfaces, 2012, pp. 1.

K.L. Mittal, "Advances in Contact Angle, Wettability and Adhesion, vol. One" https://books.google.co.in/books?, pp. 1.

* cited by examiner

METHODS FOR TREATING A POLYCARBONATE GLASS SURFACE AND FORMING DIRECTED HIERARCHICAL NANOPATTERNING AND INCREASING HYDROPHOBICITY

CROSS REFERENCE TO RELATED APPLICATIONS

This application claims the benefit of priority from U.S. Provisional Application No. 62/256,412 filed Nov. 17, 2015, the entire contents of which are herein incorporated by reference.

BACKGROUND OF THE INVENTION

Technical Field

The present disclosure relates to a method of treating a glass surface comprising a polycarbonate using solvent immersion and chemical vapors to form a textured glass surface with a directed hierarchical patterned nanoporous structure and increased hydrophobicity.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

There has been significant recent development in photovoltaics (PVs) in order to harvest high, direct, and normal irradiation and produce energy from a renewable, clean, and sustainable source. However, climate conditions such as high temperatures and dust create many challenges. For instance, during the first eight months of a photovoltaic cell's installation in a desert environment dust accumulation takes place causing a reduction in the cell's efficiency of up to 36% due to a decrease in surface light transmittance. After 15 years of exposure to the dusty and dry environment of a desert, this efficiency reduction extends to about a 72% decrease. Therefore, photovoltaic panels installed in dry environments should be designed to minimize adhesion of dust particles over the cells' surfaces. One option for achieving this is by texturing these surfaces to have a nanopattern, such as those that mimic the Lotus leaf phenomenon [Opportunities and challenges of solar energy in Saudi Arabia. Baras, W. Bamhair, Y. AlKhoshi, M. Alodan, 2012; and Self-cleaning and antireflective packaging glass for solar modules. L. K. Verma, M. Sakhuja, J. Son, A. J. Danner, H. Yang, H. C. Zeng, C. S. Bhatia. s. l.: Renewable Energy, 2011, Vol. 36, pp. 2489-2493.—each incorporated herein by reference in its entirety].

A large number of studies have been performed to develop different techniques for the design and production of hydrophobic surfaces that mimic self-cleaning plants such as the Lotus leaf by controlling the surface topography and chemistry [S. Anand, K. Rykaczewski, S. B. Subramanyam, D. Beysens, and K. K. Varanasi, "How droplets nucleate and grow on liquids and liquid impregnated surfaces," SoftMatter, vol. 3, no. 1, pp. 69-80, 2015; and Y. Yoon, D. Kim, and J. B. Lee, "Hierarchical micro/nano structures for superhydrophobic surfaces and super-lyophobic surface against liquid metal," Micro and Nano Systems Letters, vol. 2, pp. 1-18, 2014; and Y. Yoon, D.-W. Lee, and J.-B. Lee, "Fabrication of optically transparent PDMS artificial lotus leaf film using underexposed and underbaked photoresist mold," Journal of Microelectromechanical Systems, vol. 22, no. 5, pp. 1073-1080, 2013; and B. Bhushan, Y. C. Jung, and K. Koch, "Micro-, nano- and hierarchical structures for superhydrophobicity, self-cleaning and low adhesion," Philosophical Transactions of the Royal Society A: Mathematical, Physical and Engineering Sciences, vol. 367, no. 1894, pp. 1631-1672, 2009.—each incorporated herein by reference in its entirety]. The self-cleaning properties develop from the fact that the Lotus leaf surface has a hierarchical structure made of micro- and nanopatterns resulting in low adhesion forces of water droplets which aid in the droplet movement. Several crop plants also have the same characteristics like the Lotus leave, for example, Brassica, Alchemilla, and Lupinus [R. Wang, K. Hashimoto, A. Fujishima et al., "Light-induced amphiphilic surfaces," Nature, vol. 388, no. 6641, pp. 431-432, 1997; and C. Neinhuis and W. Barthlott, "Characterization and distribution of water-repellent, self-cleaning plant surfaces," Annals of Botany, vol. 79, no. 6, pp. 667-677, 1997; and T. Verho, J. T. Korhonen, L. Sainiemi et al., "Reversible switching between superhydrophobic states on a hierarchically structured surface," Proceedings of the National Academy of Sciences of the United States of America, vol. 109, no. 26, pp. 10210-10213, 2012.—each incorporated herein by reference in its entirety]. Mimicking this nature and generating surface hydrophobicity improves the performance of photovoltaic devices by minimizing the dust accumulation at the surface which results in the degradation of the material and a significant decrease in surface light transmittance.

The design of a superhydrophobic surface requires a rough and low energy surface. An important problem of the roughness is the increase in the light reflectance from the surface and, as a result, the decrease of the surface light-transmittance. Therefore, control over the roughening of the surface should be taken into consideration. In the case of a transparent substrate, roughening of its surface often causes a reduction in the level of transparency. Thus, super-hydrophobicity and transparency are competitive properties. However, transparency can be preserved provided that the surface roughness is fine enough so as to not disturb the passage of light. This can be achieved by making the surface roughness smaller in size than the wavelength of visible light [Transparent superhydrophobic thin films with self-cleaning properties. Akira Nakajima, Kazuhito Hashimoto, Kennichi Takai, Goro Yamauchi, Akira Fujishima, and Toshiya Watanabe. S. l.: Langmuir, 2000, Vol. 16, pp. 7044-7047.—incorporated herein by reference in its entirety].

Polycarbonate glass, bisphenol A type, is one of the promising materials to be modified to develop an optimal hydrophobicity/transitivity relationship due to the versatile chemical modifications using appropriate solvents. Polycarbonate (PC) glass, one of the lowest cost materials, is used as protective covers for photovoltaic (PV) panels due to its high mechanical flexibility and low density. The surface texturing of polycarbonate glass at micro/nanoscales to generate a hydrophobic texture has been reported [Z. Fan, C. Shu, Y. Yu, V. Zaporojtchenko, and F. Faupel, "Vapor induced crystallization behavior of bisphenol-A polycarbonate," Polymer Engineering&Science, vol. 46, no. 6, pp. 729-734, 2006; and N. Zhao, L. Weng, X. Zhang, Q. Xie, X. Zhang, and J. Xu, "A lotus-leaf-like superhydrophobic surface prepared by solvent induced crystallization," ChemPhysChem, vol. 7, no. 4, pp. 824-827, 2006.—each incorporated herein by reference in its entirety]. The resulting hydrophobic texture enhances the non-wetting properties by increasing the trapped air between the surface texture posts.

This, in turn, leads to a superhydrophobic behavior of the textured surface, since liquid droplets lay on the air pockets.

Many attempts have been carried out to generate superhydrophobic surfaces of polycarbonate glass by controlling surface morphology; however, all these approaches either are technically limited such as lithography or may result in the desired micro/nanoarchitecture but at the expense of optical properties. Among the promising solvents with suitable polycarbonate interactivity is acetone. Acetone induced crystallization has been studied intensely over the last decade; however, the fast dynamic of acetone crystallization results in the development of hierarchical spherules with high aspect ratio on the surface [E. Turska and H. Janeczek, "Liquid-induced crystallization of a bisphenol-A polycarbonate," *Polymer*, vol. 20, no. 7, pp. 855-858, 1979; and S. M. Aharoni and N. S. Murthy, "Effects of solvent-induced crystallization on the amorphous phase of polycarbonate of bisphenol A," *International Journal of Polymeric Materials and Polymeric Biomaterials*, vol. 42, no. 3-4, pp. 275-283, 1998; and D. Park and J.-W. Hong, "Solvent-induced crystallization and interaction parameter of the blends of bisphenol A polycarbonate and poly(phenylmethacrylate)," *Polymer Journal*, vol. 29, no. 12, pp. 970-974, 1997.—each incorporated herein by reference in its entirety]. This reduces the glass transmittance dramatically and hence reduces their applicability in photovoltaic panels.

De Oliveira et al. casted bisphenol A polycarbonate films with different molar masses and exposed them to an acetone vapor saturated environment for one and two days [De Oliveira, F. L. O., et al., Study on bisphenol-A polycarbonates samples crystallized by acetone vapor induction. Polymer bulletin, 2011. 67(6): p. 1045-1057.—incorporated herein by reference in its entirety]. The study demonstrated that there is a direct relationship between the polymer molar mass, the melting enthalpy, the size of the formed spherules and the degree of crystallization. This is likely a result of the presence of a high number of the repeating units. Further, Liu et al. studied the effect of polycarbonate thickness on the acetone transport kinetics within the polymer sheets [Liu, C. K., C. T. Hu, and S. Lee, *Effect of compression and thickness on acetone transport in polycarbonate*. Polymer Engineering & Science, 2005. 45(5): p. 687-693.—incorporated herein by reference in its entirety].

The Varanasi group made use of liquid acetone induced polycarbonated crystallization to generate superhydrophobic surfaces by immersing polycarbonate into acetone at different amounts of time [Y. Cui, A. T. Paxson, K. M. Smyth, and K. K. Varanasi, "Hierarchical polymeric textures via solvent-induced phase transformation: a single-step production of large-area superhydrophobic surfaces," *Colloids and Surfaces A: Physicochemical and Engineering Aspects*, vol. 394, pp. 8-13, 2012; and Cui, Y., et al. Superhydrophobic polymer surface via solvent-induced crystallization. in Thermal and Thermomechanical Phenomena in Electronic Systems (ITherm), 2012 13th IEEE Intersociety Conference on. 2012. IEEE.; and Varanasi, K. K., et al., Hierarchical thermoplastic surface textures formed by phase transformation and methods of making. US 20120142795A1—each incorporated herein by reference in its entirety]. The group achieved a high contact angle with low contact angle hysteresis between the textured crystallized polycarbonate surface and a water droplet. The studies demonstrated that the polymeric nanofibers form secondary texture over the spherule, having a great effect on the surface hydrophobicity. The studies did not examine the effect of the texturing process on the surface transmittance. Further, a long immersion period (i.e. ~30 min) was required to create a superhydrophobic surface, which introduces the possibility of deformation of the polycarbonate plate or the formation of powder on the surface by recrystallization of polycarbonate after solvent evaporation and the resulting significant reduction in optical properties. In addition, the research only focused on the solid liquid interface and did not refer to the use of acetone in the vapor phase.

Recently, Go et al. reported an inexpensive and facile method for fabricating nanoporous superhydrophobic polycarbonate plates by dipping them into organic solvents for a very short period of time and then modifying them with trichloromethyl silane (TCMS). The study tried different organic solvents such as $CH_2Cl_2$, methyl ethyl ketone, ethyl acetate, toluene and isopropyl alcohol [S. Go, M. Han, and Y. Ahn, "Formation of nanoporous polycarbonate surfaces and their chemical modification for superhydrophobicity," *Bulletin of the Korean Chemical Society*, vol. 33, no. 11, pp. 3899-3902, 2012.—incorporated herein by reference in its entirety]. They found that only $CH_2Cl_2$ generated nanoporous structures in a short period of time (~5 s). In their work they further silanize the surface to yield a superhydrophobic surface with a contact angle of 161°. However, the 5 s immersion in dichloromethane reduces the optical transmittance significantly.

In view of the forgoing, one object of the present disclosure is to provide a method of treating glass surfaces comprising a polycarbonate that controls the generation and growth of nanopores and spherules as well as the distance between pores to increase hydrophobicity while maintaining significant optical transmittance.

BRIEF SUMMARY OF THE INVENTION

According to a first aspect, the present disclosure relates to a method of treating a glass surface comprising a polycarbonate, the method comprising i) immersing the glass surface in a liquid phase polar aprotic solvent for less than 3 seconds to form a treated glass surface comprising nanopores and ii) exposing the treated glass surface to a vapor phase polar aprotic solvent for less than 4 minutes to form a textured glass surface with a hierarchical patterned nanoporous structure, wherein the textured glass surface has a higher surface hydrophobicity than the glass surface prior to the immersing, the exposing, or both, and wherein the textured glass surface has an optical light transmittance that is reduced by no more than 25 percentage points relative to the optical light transmittance of the polycarbonate glass surface prior to the immersing, the exposing, or both.

In one embodiment, the liquid phase polar aprotic solvent is dichloromethane and the vapor phase polar aprotic solvent is acetone.

In one embodiment, the polycarbonate is produced from the precursor monomer bisphenol A.

In one embodiment, the immersing is performed for a time period of 1.0-2.2 seconds and the exposing is performed for a time period of 0.8-1.5 minutes.

In one embodiment, the treated glass surface comprises nanopores with an average diameter in the range of 100-800 nm and an average depth in the range of 2-15 nm.

In one embodiment, the average distance between the nanopores of the treated glass surface is in the range of 1-10 μm.

In one embodiment, the texture glass surface with a hierarchical patterned nanoporous structure comprises pores with an average diameter of 200-1000 nm and an average depth of 20-150 nm.

In one embodiment, the textured glass surface with a hierarchical patterned nanoporous structure comprises spherules with an average width of 5-20 μm and an average height of 0.2-5 μm.

In one embodiment, the surface of the spherules is textured and comprises fibers with an average diameter of 200-600 nm and an average height of 20-200 nm.

In one embodiment, the textured glass surface has an average water droplet coating angle of greater than 75°.

In one embodiment, the treated glass surface has an optical light transmittance of greater than 85% and the textured glass surface has an optical light transmittance of greater than 75%.

In one embodiment, the textured glass surface has a roughness root mean square value in the range of 100-500 nm.

In one embodiment, the method further comprises dip coating the textured glass surface in a sol gel comprising a silane and an orthosilicate compound to form a coated textured glass surface.

In one embodiment, the silane is 1,1,1,3,3,3-hexamethyl disilazane (HMDS) and the orthosilicate compound is tetraethyl orthosilicate (TEOS).

In one embodiment, the coated textured glass surface has an average water droplet contact angle of greater than 130°.

In one embodiment, the coated textured glass surface has an optical light transmittance of greater than 45%.

According to a second aspect, the present disclosure relates to a textured bisphenol A polycarbonate glass surface comprising a hierarchical patterned nanoporous structure comprising pores with an average diameter of 200-1000 nm and an average depth of 20-150 nm which has a water droplet contact angle of greater than 75°, an optical light transmittance of greater than 75%, and a roughness root mean square value in the range of 100-500 nm.

According to a third aspect, the present disclosure relates to a photovoltaic cell comprising the textured bisphenol A polycarbonate glass surface.

According to a fourth aspect, the present disclosure relates to a coated textured glass surface, comprising i) a bisphenol A polycarbonate glass surface with a hierarchical patterned nanoporous structure and ii) a sol gel coating layer comprising 1,1,1,3,3,3-hexamethyl disilazane (HMDS) and tetraethyl orthosilicate (TEOS) sol gel coating layer, wherein the sol gel coating layer is disposed on and in continuous contact with the glass surface, wherein the hierarchical patterned nanoporous structure comprises pores with an average diameter of 200-1000 nm and an average depth of 20-150 nm, and wherein the coated textured glass surface has a water droplet contact angle of greater than 130°, an optical light transmittance of greater than 45%, and a roughness root mean square value in the range of 100-500 nm.

According to a fifth aspect, the present disclosure relates to a photovoltaic cell comprising the coated textured glass surface.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
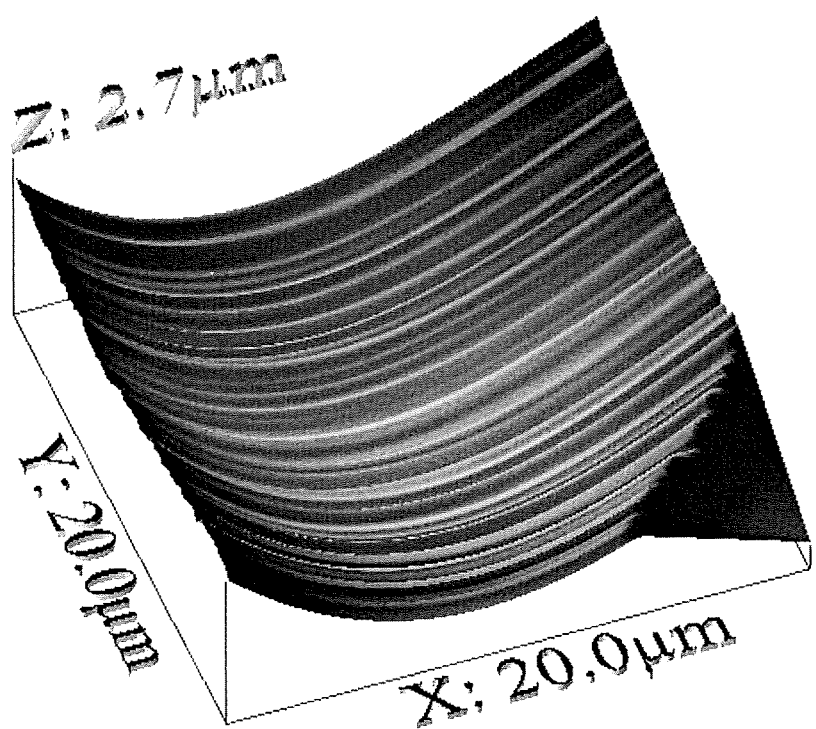
FIG. 1 is a 3D atomic force microscopy (AFM) topography image of a smooth untreated polycarbonate glass surface.

Embodiments of the present disclosure will now be described more fully hereinafter with reference to the accompanying drawings, in which some, but not all of the embodiments of the present disclosure are shown.

According to a first aspect, the present disclosure relates to a method of treating a glass surface comprising a polycarbonate, the method comprising i) immersing the glass surface in a liquid phase polar aprotic solvent for less than 3 seconds to form a treated glass surface comprising nanopores and ii) exposing the treated glass surface to a vapor phase polar aprotic solvent for less than 4 minutes to form a textured glass surface with a hierarchical patterned nanoporous structure, wherein the textured glass surface has a higher surface hydrophobicity than the glass surface prior to the immersing, the exposing, or both, and wherein the textured glass surface has an optical light transmittance that is reduced by no more than 25 percentage points relative to the optical light transmittance of the polycarbonate glass surface prior to the immersing, the exposing, or both.

A used herein, polycarbonates (PC) are a group of thermoplastic polymers containing carbonate groups (—O—(C=O)—O—) in their chemical structures. Polycarbonates are substantially transparent polymers comprising monomers containing hydrophobic phenyl and methyl groups and a hydrophilic carbonate group. As used herein, a thermoplastic or thermosoftening plastic is a plastic material, a polymer that becomes pliable or moldable above a specific temperature and solidifies upon cooling. Many polymer thermoplastics are considered glass or polymer glass (i.e. acrylic glass, polycarbonate, and polyethylene terephthalate) and are a lighter alternative to traditional glass. It is equally envisioned that the glass comprising a polycarbonate may comprise one or more additional thermoplastics. These thermoplastics may be used in addition to or in lieu of a polycarbonate. Exemplary additional thermoplastics include, but are not limited to, acrylic, poly(methyl methacrylate (PMMA), acrylonitrile butadiene styrene (ABS), nylon, polylactic acid (polylactide), polybenzimidazole, polyether sulfone, polyetherether keton (PEEK), polyetherimide (PEI), polyethylene (PE, UHMWPE, HDPE, MDPE, LDPE, XLPE, PEX), polyphenylene oxide (PPO), polyphenylene sulfide (PPS), polypropylene (PP), polystyrene, polyvinyl chloride, Teflon, and the like.

In a preferred embodiment, the polycarbonate is produced from the precursor monomer bisphenol A. Often the majority of polycarbonate materials are produce by the reaction of bisphenol A (BPA) with phosgene $COCl_2$. As used herein, bisphenol A refers to an organic synthetic compound with the chemical formula $(CH_3)_2C(C_6H_4OH)_2$ belonging to the group of diphenylmethane derivatives and bisphenols, with two hydroxyphenyl groups. It is equally envisioned that one or more additional precursor monomers may produce the polycarbonate. Exemplary additional precursor monomers that may be used in addition to, or in lieu of bisphenol A, include, but are not limited to, bisphenol AP, bisphenol AF, bisphenol B, bisphenol BP, bisphenol C, bisphenol C 2, bisphenol E, bisphenol F, bisphenol G, bisphenol M, bisphenol S, bisphenol P, bisphenol PH, bisphenol TMC, bisphenol Z, MBHA, BisOPP-A, PHBB, 2,4-BPS, TGSA, BPS-MAE, BPS-MPE, 4-hydroxyphenyl, and the like.

As used herein, a polar solvent refers to a solvent having large dipole moments or partial charges often containing bonds between atoms with very different electronegativities. As used herein, a polar aprotic solvent refers to a solvent that may have hydrogens by that lacks —OH or —NH bonds and therefore cannot hydrogen bond with itself. Exemplary polar aprotic solvents include, but are not limited to, dichloromethane, tetrahydrofuran, ethyl acetate, acetone, N,N-dimethylformamide, acetonitrile, dimethyl sulfoxide and the like. In a preferred embodiment, the liquid phase polar aprotic solvent is dichloromethane. In a preferred embodiment, the vapor phase polar aprotic solvent is acetone. In a most preferred embodiment the liquid phase polar aprotic solvent is dichloromethane and the vapor phase polar aprotic solvent is acetone.

In one step the glass surface is immersed in a liquid phase polar aprotic solvent, preferably dichloromethane, for less than 3 seconds, preferably less than 2.8 seconds, preferably less than 2.4 seconds, preferably less than 2.2 seconds, or about 2.0 seconds to form a treated glass surface comprising nanopores.

The treated glass surface comprising nanopores are first generated by immersing the polycarbonate glass in a polar aprotic solvent, preferably dichloromethane. In most instances, the immersing duration is important for maintaining the optical properties of the material to be useful in photovoltaic solar panels. After 2 seconds of immersion in dichloromethane the polycarbonate glass surface or treated glass surface maintains at least 80% transmittance. Therefore a 2 second immersion duration in dichloromethane is considered advantageous for this step.

In a preferred embodiment, the treated glass surface comprises nanopores with an average diameter or width in the range of 100-800 nm, preferably 120-700 nm, preferably 140-650 nm, preferably 160-625 nm, preferably 180-600 nm. In another embodiment, the average diameter or width does not exceed 10 μm, preferably 8 μm, preferably 6 μm, preferably 4 μm, preferably 2 μm, preferably 1 μm. In a preferred embodiment, the treated glass surface comprises nanopores with an average depth in the range of 2-15 nm, preferably 2.5-10 nm, preferably 3-8 nm, preferably 3.5-6 nm, preferably 4-5 nm. In another embodiment the average depth does not exceed 8 nm, preferably 6 nm, preferably 5 nm, preferably 4 nm, preferably 3 nm. In a preferred embodiment, the average distance between the nanopores of the treated glass surface is in the range of 1-10 μm, preferably 2-8 μm, preferably 3-6 μm, preferably 4-5 μm. This is shown in FIG. 5, FIG. 6, FIG. 7, and FIG. 8.

In another step the treated glass surface is exposed to a vapor phase polar aprotic solvent, preferably acetone for less than 4 minutes, preferably less than 3.5 minutes, preferably less than 3 minutes, preferably less than 2.5 minutes, preferably less than 2.0 minutes, preferably less than 1.5 minutes, preferably less than 1.25 minutes, or about 1.0 minute to form a textured glass surface with a hierarchical patterned nanoporous structure. In one embodiment, the vapor phase polar aprotic solvent is not dichloromethane, methyl ethyl ketone, or ethyl acetate.

As used herein, hierarchical patterned structure or hierarchical patterned nanoporous structure refers to exhibiting structure on more than one length scale, and thus, the structural elements themselves having structure. For example, polymers can exhibit structural hierarchy on the molecular, ultrastructural, microstructural, and/or nanostructural level. Polymers may have spherules on the scale of μm while the spherules themselves contain an ordered texture on the scale of nm.

Accordingly, nucleation occurs at the initial stage of vapor phase polar aprotic solvent, preferably acetone, induced crystallization and poor crystals become perfect through segment reorganization with increasing exposure time and spherulites' growth at elongated periods of exposure. The generation of spherules with needle-like textured structure is related back to a molecular or atomic rearrangement process that takes place in order to achieve stable orientations, which is termed a crystallization process. High spherules density increases drastically the surface roughness and hydrophobicity at the expense of the optical properties. A large number of spherules that cover the whole surface to improve the hydrophobicity will reduce the surface transmittance and hence limit its applicability in photovoltaic solar panels. It is envisioned that polar aprotic solvent vapors, preferably acetone, reduce the crystallization dynamic time since much less polar aprotic solvent is available at the surface which prevents absorption by the surface layer compared to liquid polar aprotic solvent.

In a preferred embodiment, the vapor phase polar aprotic solvent is acetone and the acetone source is heated to greater than 24° C., preferably greater than 26° C., preferably greater than 28° C., preferably greater than 30° C., preferably greater than 32° C., preferably greater than 33° C. to enhance evaporation In a preferred embodiment, the textured glass surface with a hierarchical patterned nanoporous structure comprises pores with an average diameter or width of 200-1000 nm, preferably 250-990 nm, preferably 300-980 nm, preferably 350-970 nm, preferably 400-950 nm, preferably 450-900 nm, preferably 500-800 nm. In a preferred embodiment, the textured glass surface with a hierarchical patterned nanoporous structure comprises pores with an average depth in the range of 20-150 nm, preferably 30-130 nm, preferably 40-120 nm, preferably 50-100 nm, preferably 60-90 nm. In another embodiment, the average depth does not exceed 120 nm, preferably 115 nm, preferably 110 nm, preferably 105 nm, preferably 103 nm. This is shown in FIG. 10, FIG. 11A, FIG. 11B, FIG. 12, FIG. 13, FIG. 14, and FIG. 15.

In certain embodiments, the textured glass surface with a hierarchical patterned nanoporous structure comprises spherules with an average width of 5-20 μm, preferably 8-18 μm, preferably 10-15 μm, or about 13 μm. In certain embodiments, the textured glass surface with a hierarchical patterned nanoporous structure comprises spherules with an average height of 0.2-5 µm, preferably 0.5-2.5 µm, preferably 1.0-2.0 µm, or about 1.5 µm. In certain embodiments, the surface of the spherules is textured and comprises fibers with an average diameter of 200-600 nm, preferably 300-550 nm, preferably 400-500 nm, or about 450 nm and an average height of 20-200 nm, preferably 50-180 nm, preferably 100-160 nm, preferably 125-150 nm. This is shown in FIG. 16A, FIG. 16B, FIG. 17, FIG. 18, FIG. 19, and FIG. 20.

In a preferred embodiment, the immersing is performed for less than 3 seconds, preferably less than 2.8 seconds, preferably less than 2.4 seconds, preferably less than 2.2 seconds, or about 2.0 seconds, such as for example 0.2-2.8 seconds, preferably 0.5-2.6 seconds, preferably 0.75-2.4 seconds, preferably 1.0-2.2 seconds, preferably 1.5-2.1 seconds and the exposing is performed for less than 4 minutes, preferably less than 3.5 minutes, preferably less than 3 minutes, preferably less than 2.5 minutes, preferably less than 2.0 minutes, preferably less than 1.5 minutes, preferably less than 1.25 minutes, or about 1.0 minute, such as for example 0.2-4.0 minutes, preferably 0.5-3.0 minutes, preferably 0.75-2.0 minutes, preferably 0.8-1.5 minutes. In a most preferred embodiment, the immersing is performed for a time period of 2 seconds and the exposing is performed for a time period of 1 minute. In a most preferred embodiment, the liquid phase polar aprotic solvent is dichloromethane and the immersing is performed for a time period of 2 seconds and the vapor phase polar aprotic solvent is acetone and the exposing is performed for a time period of 1 minute.

As used herein, surface hydrophobicity is a measure of the wetting properties of a material's surface and relates to the difficulty or ease by which the surface is wet. In a number of technology fields and industrial application, materials with one or more hydrophobic surfaces or one or more super hydrophobic surfaces are advantageous due to their self-cleaning properties and relative difficulty to wet which in an antibacterial setting may reduce and minimize the contact area of bacterial fluid. One measure for surface hydrophobicity is the droplet contact angle of a liquid, common and exemplary liquids include, but are not limited to, water, glycerol and diiodomethane. As used herein, the term "hydrophobic" surface generally refers to surfaces which have a contact angle from 90-150° with a droplet of water, and the term "superhydrophobic" surface generally refers to surfaces which have a contact angle greater than 150° with a droplet of water. In a preferred embodiment, the textured glass surface of the present disclosure has a higher surface hydrophobicity than the glass surface prior to the immersing, the exposing, or both. In one embodiment, the contact angle of the polycarbonate glass surface and the textured glass surface may be determined using a contact angle goniometer.

In one embodiment, the textured glass surface has an average water droplet contact angle of greater than 75°, preferably greater than 76°, preferably greater than 77°, preferably greater than 78°, preferably greater than 79°, preferably greater than 80°, preferably greater than 81°, preferably greater than 82°, preferably greater than 84°, preferably greater than 860, preferably greater than 88°, preferably greater than 90°, preferably greater than 95°, preferably greater than 100°, preferably greater than 105°. For example, the textured glass surface has an average water droplet contact angle in the range of 60-105°, preferably 65-100°, preferably 70-95°, preferably 72-90°, preferably 74-88°, preferably 76-86°, preferably 77-85°, preferably 78-84°, preferably 78-82°. In one embodiment, the method increases the surface hydrophobicity as measured by an average water droplet contact angle of the textured glass surface by at least 0.5%, preferably at least 1.0%, preferably at least 1.5%, preferably at least 2.0%, preferably at least 2.5%, preferably at least 3.0%, preferably at least 4.0%, preferably at least 5.0%, preferably at least 6%, preferably at least 8%, preferably at least 10%, preferably at least 15%, preferably at least 20%, preferably at least 25% relative to a glass surface that is not immersed, exposed, or both (i.e. the percent increase in water droplet contact angle from the glass surface to the textured glass surface).

In one embodiment, the textured glass surface has an average glycerol droplet contact angle in the range of 40-120° preferably 60-105°, preferably 65-100°, preferably 70-95°, preferably 72-90°, preferably 74-88°, preferably 76-86°, preferably 77-85°, preferably 78-84°, preferably 78-82°. In one embodiment, the method increases the surface hydrophobicity as measured by an average glycerol droplet contact angle of the textured glass surface by at least 0.5%, preferably at least 1.0%, preferably at least 1.5%, preferably at least 2.0%, preferably at least 2.5%, preferably at least 3.0%, preferably at least 4.0%, preferably at least 5.0%, preferably at least 6%, preferably at least 8%, preferably at least 10%, preferably at least 15%, preferably at least 20%, preferably at least 25% relative to a glass surface that is not immersed, exposed, or both. In one embodiment, the textured glass surface has an average diiodomethane droplet contact angle in the range of 40-120°, preferably 60-105°, preferably 65-100°, preferably 70-95°, preferably 72-90°, preferably 74-88°, preferably 76-86°, preferably 77-85°, preferably 78-84°, preferably 78-82°. In one embodiment, the method increases the surface hydrophobicity as measured by an average diiodomethane droplet contact angle of the textured glass surface by at least 0.5%, preferably at least 1.0%, preferably at least 1.5%, preferably at least 2.0%, preferably at least 2.5%, preferably at least 3.0%, preferably at least 4.0%, preferably at least 5.0%, preferably at least 6%, preferably at least 8%, preferably at least 10%, preferably at least 15%, preferably at least 20%, preferably at least 25% relative to a glass surface that is not immersed, exposed, or both.

As used herein, surface roughness (roughness) is a component of surface texture. It is quantified by the deviations in the direction of the normal vector of a real surface from its ideal form. If these deviations are large, the surface is rough; if they are small, the surface is smooth. Roughness is often considered to be the high-frequency, short-wavelength component of a measured surface. In one embodiment, roughness can be measured by manual comparison against a sample of known surface roughness, alternatively a surface profile measurement may be made with a profilometer that can be contact and/or optical.

In one embodiment, the textured glass surface has a roughness root mean square taken over a 5 µm scale value in the range of 100-500 nm, preferably 110-450 nm, preferably 120-400 nm, preferably 140-375 nm, preferably 160-350 nm, preferably 180-325 nm, preferably 200-300 nm, preferably 210-290 nm, preferably 220-280 nm, preferably 230-270 nm. In one embodiment, the method increases the roughness root mean square value of the textured glass surface by at least 25%, preferably at least 50%, preferably at least 75%, preferably at least 100%, preferably at least 150%, preferably at least 200%, preferably at least 250%, preferably at least 300% relative to a glass surface that is not immersed, exposed, or both.

As used herein, the coefficient of friction is a dimensionless scalar value which describes the ratio of the force of friction between two bodies and the force pressing them together. In general, coefficients of friction range from near zero to greater than one. In one embodiment, the textured polycarbonate surface has a coefficient of friction in the range of 0.025-0.75, preferably 0.05-0.50, preferably 0.10-0.45, preferably 0.20-0.40, preferably 0.25-0.35. In a preferred embodiment, the method of the present disclosure decreases the coefficient of friction of the textured polycarbonate glass surface relative to a treated/immersed polycarbonate glass surface and/or an untreated polycarbonate glass surface that is not exposed to the vapor phase polar aprotic solvent of the present method described herein, the coefficient of friction of the textured polycarbonate glass surface is less than the coefficient of friction of a treated/immersed polycarbonate glass surface and/or an untreated polycarbonate glass surface that is not exposed to the vapor phase polar aprotic solvent.

As used herein, transmittance of the surface of a material is its effectiveness in transmitting radiant energy. It is the fraction of incident electromagnetic power that is transmitted through a sample. Internal transmittance refers to energy loss by absorption, whereas "total" transmittance refers to that which is due to absorption, scattering, reflection, etc. As used herein, optical light transmittance or visible transmittance refers to the amount of light in the UV-visible portion of the spectrum that passes through the material, preferably light having a wavelength of 400-800 nm, preferably 450-750 nm, preferably 500-600 nm.

In a preferred embodiment, the treated glass surface has an optical light transmittance of greater than 85%, preferably greater than 86%, preferably greater than 87%, preferably greater than 88%, preferably greater than 89%, preferably greater than 90%, preferably greater than 92% and the textured glass surface has an optical light transmittance of greater than 75%, preferably greater than 76%, preferably greater than 77%, preferably greater than 78%, preferably greater than 79%, preferably greater than 80%, preferably greater than 82%, preferably greater than 84%, preferably greater than 86%, preferably greater than 88%, preferably greater than 90%. In a preferred embodiment, the textured glass surface has an optical light transmittance that is reduced by no more than 25 percentage points relative to the optical light transmittance of the polycarbonate glass surface prior to the immersing, the exposing, or both, preferably no more than 20 percentage points, preferably no more than 18 percentage points, preferably no more than 16 percentage points, preferably no more than 14 percentage points, preferably no more than 12 percentage points, preferably no more than 10 percentage points, preferably no more than 8 percentage points, preferably no more than 5 percentage points.

In a preferred embodiment, the method further comprises dip coating the textured glass surface in a sol gel comprising a silane and an orthosilicate compound to form a coated textured glass surface. In a preferred embodiment the formed sol gel coating covers (in terms of % surface area) greater than 50% of the textured glass surface, preferably greater than 60%, preferably greater than 70%, preferably greater than 80%, preferably greater than 85%, preferably greater than 90%, preferably greater than 95%, preferably greater than 98%, preferably greater than 99/c %.

As used herein, a sol gel refers to a process or a method for producing solid materials from small molecules. The process involves conversion of monomers into a colloidal solution (or sol) that acts as the precursor for an integrated network (or gel) of either discrete particles or network polymers. One of the largest application areas of sol gels is in thin films and protective coatings which can be produced on a piece of substrate (i.e. the textured polycarbonate glass surface) by spin coating or dip coating. Generally deposition grade silanes comprise alkoxysilanes and/or their predecessors such as chlorosilane. Transformations of the alkoxysilanes during the processing proceed through a series of subsequent hydrolysis, condensation and thermal treatment steps. Exemplary silanes and their precursors include, but are not limited to, allyltrimethoxysilane, butyltrichlorosilane, ethyltrichlorosilane, isobutyl(trimethoxy)silane, [3-(diethylamino)propyl]trimethoxysilane, methyltrichlorosilane, N-propyltriethoxysilane, pentyltrichlorosilane, tetramethyl orthosilicate, tetrapropyl orthosilicate, triethoxy(octyl)silane, triethoxyphenylsilane, triethoxyvinylsilane, trimethoxymethylsilane, trimethoxyphenylsilane, 1,1,1,3,3,3-hexamethyl disilazane (HMDS) and the like. In a preferred embodiment, the silane is 1,1,1,3,3,3-hexamethyl disilazane (HMDS). In a preferred embodiment, the organosilicon compound is an orthosilicate. Exemplary orthosilicates include, but are not limited to, tetraethyl orthosilicate, tetramethyl orthosilicate, tetrapropyl orthosilicate, tetrabutyl orthosilicate, tetraallyl orthosilicate, tetrakis(dimethylsilyl) orthosilicate, tetraamyl orthosilicate and the like. In a preferred embodiment the organosilicaon compound is tetraethyl orthosilicate (TEOS). In a preferred embodiment the ratio of HMDS:TEOS is 0.5-5, preferably 1-4, preferably 1.5-3, preferably 1.75-2.5, or about 2.

In one embodiment, the coated textured glass surface has an average water droplet contact angle of greater than 130°, preferably greater than 131°, preferably greater than 132°, preferably greater than 133°, preferably greater than 134°, preferably greater than 135°, preferably greater than 136°, preferably greater than 137°, preferably greater than 138°, preferably greater than 139°, preferably greater than 140°, preferably greater than 145°, preferably greater than 150°, preferably greater than 155°, preferably greater than 160°. For example, the textured glass surface has an average water droplet contact angle in the range of 130-160°, preferably 131-155°, preferably 132-150°, preferably 133-145°, preferably 134-142°, preferably 135-140°. In one embodiment, the method increases the surface hydrophobicity as measured by an average water droplet contact angle of the coated textured glass surface by at least 10%, preferably at least 15%, preferably at least 20%, preferably at least 25%, preferably at least 30%, preferably at least 35%, preferably at least 40%, preferably at least 45%, preferably at least 50%, preferably at least 60%, preferably at least 70%, preferably at least 75%, preferably at least 80%, preferably at least 100% relative to a textured glass surface that is not coated (i.e. the percent increase in water droplet contact angle from the textured glass surface to the coated textured glass surface).

In one embodiment, the coated textured glass surface has an average glycerol droplet contact angle in the range of 110-170°, preferably 130-160°, preferably 131-155°, preferably 132-150°, preferably 133-145°, preferably 134-142°, preferably 135-140°. In one embodiment, the method increases the surface hydrophobicity as measured by an average glycerol droplet contact angle of the coated textured glass surface by at least by at least 10%, preferably at least 15%, preferably at least 20%, preferably at least 25%, preferably at least 30%, preferably at least 35%, preferably at least 40%, preferably at least 45%, preferably at least 50%, preferably at least 60%, preferably at least 70%, preferably at least 75%, preferably at least 80%, preferably at least 100% relative to a textured glass surface that is not coated. In one embodiment, the coated textured glass surface has an average diiodomethane droplet contact angle in the range of 110-170°, preferably 130-160°, preferably 131-155°, preferably 132-150°, preferably 133-145°, preferably 134-142°, preferably 135-140°. In one embodiment, the method increases the surface hydrophobicity as measured by an average diiodomethane droplet contact angle of the textured glass surface by at least 15%, preferably at least 20%, preferably at least 25%, preferably at least 30%, preferably at least 35%, preferably at least 40%, preferably at least 45%, preferably at least 50%, preferably at least 60%, preferably at least 70%, preferably at least 75%, preferably at least 80%, preferably at least 100% relative to a textured glass surface that is not coated.

In one embodiment, the coated textured glass surface has a roughness root mean square taken over a 5 μm scale value in the range of 100-500 nm, preferably 150-475 nm, preferably 200-450 nm, preferably 250-425 nm, preferably 300-400 nm, preferably 310-390 nm, preferably 320-380 nm, preferably 325-375 nm, preferably 340-370 nm, preferably 350-368 nm. In one embodiment, the method increases the roughness root mean square value of the textured glass surface by at least 25%, preferably at least 50%, preferably at least 75%, preferably at least 100%, preferably at least 150%, preferably at least 200%, preferably at least 250%, preferably at least 300% relative to a textured glass surface that is not coated.

In one embodiment, the coated textured polycarbonate surface has a coefficient of friction in the range of 0.01-0.80, preferably 0.025-0.75, preferably 0.05-0.50, preferably 0.10-0.45, preferably 0.20-0.40, preferably 0.25-0.35. In a preferred embodiment, the method of the present disclosure decreases the coefficient of friction of the textured polycarbonate glass surface relative to a textured/treated/immersed polycarbonate glass surface and/or an untreated polycarbonate glass surface that is not coated by the present method described herein, the coefficient of friction of the coated textured polycarbonate glass surface is less than the coefficient of friction of a textured/treated/immersed polycarbonate glass surface and/or an untreated polycarbonate glass surface that is not coated.

In a preferred embodiment, the coated textured glass surface has an optical light transmittance of greater than 45%, preferably greater than 46%, preferably greater than 47%, preferably greater than 48%, preferably greater than 49%, preferably greater than 50%, preferably greater than 55%, preferably greater than 60%, preferably greater than 65%, preferably greater than 70%, preferably greater than 75%, preferably greater than 80%, preferably greater than 82%, preferably greater than 85%. In a preferred embodiment, the coated textured glass surface has an optical light transmittance that is reduced by no more than 60 percentage points relative to the optical light transmittance of the textured glass surface prior to the coating, preferably no more than 50 percentage points, preferably no more than 45 percentage points, preferably no more than 40 percentage points, preferably no more than 35 percentage points, preferably no more than 30 percentage points, preferably no more than 25 percentage points, preferably no more than 20 percentage points, preferably no more than 15 percentage points, preferably no more than 10 percentage points, preferably no more than 5 percentage points.

In one embodiment, the method described herein in any of its embodiments may further comprise coating the treated glass surface, the textured glass surface, and/or the coated textured glass surface with a hydrophobic layer to form a more hydrophobic and/or superhydrophobic glass surface. It is envisaged that adding one or more hydrophobic layers to an already treated/textured/coated surface as defined herein may increase the surface contact angle, and therefore the hydrophobicity of the surface. The hydrophobic layer may be in addition to or in lieu of the sol gel coating.

In one embodiment, the hydrophobic layer comprises at least one selected from the group consisting of a fluorocarbon, a perfluorocarbon, a resin, a hydrophobic fatty acid and a hydrophobic self-assembled monolayer. Exemplary fluorocarbons and perfluorocarbons include, but are not limited to, i) fluoroalkanes such as carbon tetrafluoride, perfluorooctane, perfluoro-2-methylpentane, perfluorooctanoic acid, perfluoro-1,3-dimethylcyclohexane, perfluorodecalin, hexafluoroethane, perfluoropentane, pefluoromethylcyclohexane, perfluoro-1,3-dimethylcyclohexane, perfluoromethyldecalin, ii) fluoroalkenes/fluoralkynes such as perfluoroisobutene, tetrafluoroethylene, hexafluoropropylene, hexafluorobutyne, iii) perfluoroaromatic compounds such as hexafluorobenzene, octafluorotoluene, and octafluoronaphthalene and iv) fluoropolymers such as polyvinylfluoride, polyvinylidene fluoride, polytetrafluoroethylene, polychlorotrifluoroethylene, fluorinated ethylene-propylene, perfluropolyether, perfluoropolyoxetane, pefluoroalkoxy polymer, polyethylenetetrafluoroethylen, polyethylenechlorotrifluoroethylene, and the like.

Exemplary resins and/or films include, but are not limited to, films or resins made from carbon layers or carbon sheets, phenolic resins, epoxy resins (e.g. bisphenol A and F epoxy resins, glycidylamine epoxy resin, aliphatic epoxy resin, etc.), polystyrene (PS), poly(methylmethacralate), manganese oxide polystyrene ($MnO_2$/PS) nanocomposite, zinc oxide polystyrene (ZnO/PS) nanocomposite, precipitated calcium carbonate, carbon nanotube structures, silica nanocoating, nanopin film, and the like.

The hydrophobic fatty acid that may be used to coat the treated glass surface, the textured glass surface, and/or the coated textured glass surface may be selected from the group including, but not limited to propanoic acid, butanoic acid, pentanoic acid, hexanoic acid, heptanoic acid, octanoic acid, nonanoic acid, decanoic acid, undecanoic acid, dodecanoic and, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, henatriacontanoic acid, dotriacontanoic acid, tritriacontanoic acid, tetratriacontanoic acid, pentatriacontanoic acid, hexatriacontanoic acid and combinations thereof.

As used herein, self-assembled monolayers (SAM) refer to molecular assemblies formed spontaneously on a surface by adsorption and are essentially organized into ordered domains. In some cases the molecules that form the monolayer may not interact strongly with the substrate. In other cases the molecules may possess a head group that has a strong affinity for the substrate and may anchor the molecule to it. In one embodiment, the treated glass surface, the textured glass surface, and/or the coated textured glass surface is coated with a hydrophobic layer comprising a self-assembled monolayer. Exemplary self-assembled monolayers include, but are not limited to, (11-mercatoundecyl)tetra(ethylene glycol), [11-(methylcarbonylthio)undecyl]-tetra-(ethylene glycol), tetra(ethylene glycol) dithiol, 1-hexadecanethiol and the like.

According to a second aspect, the present disclosure relates to a textured bisphenol A polycarbonate glass surface comprising a hierarchical patterned nanoporous structure comprising pores with an average diameter of 200-1000 nm, preferably 250-990 nm, preferably 300-980 nm, preferably 350-970 nm, preferably 400-950 nm, preferably 450-900 nm, preferably 500-800 nm and an average depth of 20-150 nm, preferably 30-130 nm, preferably 40-120 nm, preferably 50-100 nm, preferably 60-90 nm which has a water droplet contact angle of greater than 75°, preferably greater than 76°, preferably greater than 77°, preferably greater than 78°, preferably greater than 79°, preferably greater than 80°, preferably greater than 81°, preferably greater than 82°, preferably greater than 84°, preferably greater than 86°, preferably greater than 88°, preferably greater than 90°, preferably greater than 95°, preferably greater than 100°, preferably greater than 105°, an optical light transmittance of greater than 75%, preferably greater than 76%, preferably greater than 77%, preferably greater than 78%, preferably greater than 79%, preferably greater than 80%, preferably greater than 82%, preferably greater than 84%, preferably greater than 86%, preferably greater than 88%, preferably greater than 90%, and a roughness root mean square value in the range of 100-500 nm, preferably 110-450 nm, preferably 120-400 nm, preferably 140-375 nm, preferably 160-350 nm, preferably 180-325 nm, preferably 200-300 nm, preferably 210-290 nm, preferably 220-280 nm, preferably 230-270 nm.

According to a third aspect, the present disclosure relates to a photovoltaic or solar cell comprising the textured bisphenol A polycarbonate glass surface. In a preferred embodiment, the textured bisphenol A polycarbonate glass surface would serve as a transparent solar glass panel or array.

As used herein, a solar cell or photovoltaic cell refers to an electrical device that converts the energy of light directly into electricity by the photovoltaic effect. Exemplary types of solar cells or photovoltaic cells include, but are not limited to, amorphous silicon solar cells, biohybrid solar cells, buried contact solar cells, cadmium telluride solar cells, concentrated PV solar cells, copper indium gallium selenide solar cells, dye-sensitized solar cells, gallium arsenide germanium solar cells, hybrid solar cells, luminescent solar concentrator cells, micromorph cells, monocrystalline solar cells, multi-junction solar cells, nanocrystal solar cells, organic solar cells, perovskite solar cells, photoelectrochemical cells, plasmonic solar cells, plastic solar cells, polycrystalline solar cells, polymer solar cells, quantum dot solar cells, solid-state solar cells, thin-film solar cells, and wafer solar cells.

According to a fourth aspect, the present disclosure relates to a coated textured glass surface, comprising i) a bisphenol A polycarbonate glass surface with a hierarchical patterned nanoporous structure and ii) a sol gel coating layer comprising 1,1,1,3,3,3-hexamethyl disilazane (HMDS) and tetraethyl orthosilicate (TEOS), wherein the sol gel coating layer is disposed on and in continuous contact with the glass surface, wherein the hierarchical patterned nanoporous structure comprises pores with an average diameter of 200-1000 nm, preferably 250-990 nm, preferably 300-980 nm, preferably 350-970 nm, preferably 400-950 nm, preferably 450-900 nm, preferably 500-800 nm and an average depth of 20-150 nm, preferably 30-130 nm, preferably 40-120 nm, preferably 50-100 nm, preferably 60-90 nm, and wherein the coated textured glass surface has a water droplet contact angle of greater than 130°, preferably greater than 131°, preferably greater than 132°, preferably greater than 133°, preferably greater than 134°, preferably greater than 135°, preferably greater than 136°, preferably greater than 137°, preferably greater than 138°, preferably greater than 139°, preferably greater than 140°, preferably greater than 145°, preferably greater than 150°, preferably greater than 155°, preferably greater than 160°, an optical light transmittance of greater than 45%, preferably greater than 46%, preferably greater than 47%, preferably greater than 48%, preferably greater than 49%, preferably greater than 50%, preferably greater than 55%, preferably greater than 60%, preferably greater than 65%, preferably greater than 70%, preferably greater than 75%, preferably greater than 80%, preferably greater than 82%, preferably greater than 85%, and a roughness root mean square value in the range of 100-500 nm, 100-500 nm, preferably 150-475 nm, preferably 200-450 nm, preferably 250-425 nm, preferably 300-400 nm, preferably 310-390 nm, preferably 320-380 nm, preferably 325-375 nm, preferably 340-370 nm, preferably 350-368 nm. According to a fifth aspect, the present disclosure relates to a photovoltaic or solar cell comprising the coated textured glass surface.

The examples below are intended to further illustrate methods and protocols for treating and characterizing the textured glass surfaces or coated textured glass surfaces comprising a polycarbonate of the present disclosure. Further, they are intended to illustrate assessing the properties of these hierarchical patterned nanoporous structured surfaces. They are not intended to limit the scope of the claims.

EXAMPLE 1

General Materials and Methods of Characterization for Prepared Superhydrophobic Surfaces Bisphenol A polycarbonate sheets [2,2-bis(p-hydroxyphenyl) propane] of 3 mm thickness made by Juliet Company were used. Solvents used were reagent grade and acquired from Sigma-Aldrich. Dichloromethane puriss. p.a., ACS reagent reag. ISO, ≥99.9% (GS) (Sigma-Aldrich) was used to initiate the nanopores. Acetone solvent from Sigma-Aldrich (purity ≥99.5% b.p.: 56° C., MW: 58.08, and v.p.: 184 mmHg at 20° C.) was used for the vapor induced crystallization process. Tetraethoxysilane (TEOS) and 1,1,1,3,3,3-hexamethyldisilazane (HMDS) were purchased from Sigma-Aldrich and used in the sol gel method to generate a superhydrophobic coating on polycarbonate glass.

Several characterization techniques were utilized in order to study the different effects of changing the experimental parameters within the study of the chemical and physical properties of the textured surfaces. Atomic force microscopy (AFM) molecular imaging (PicoSPM LE5100, Agilent Technologies) was used to scan, determine, and characterize surface topography and roughness profile in contact. Image analysis was performed using WSxM v5.0 Develop 6.2. Silicon nitride probes tips manufactured by Bruker AFM Probes Co. were used with a radius in the range of 20-60 nm and a specified force constant (k) of 0.12 N/m. Fourier-Transform Infrared (FTIR) spectroscopy (model 6700 from Thermo Electron Corporation) was utilized to carry out the identification of different functional groups that are present on the surface before and after the texturing process. A UV-Vis spectrophotometer (Lambda EZ 210 from PerkinElmer Company) was utilized to measure the transmittance of the polycarbonate sheet before and after the patterning process. A Goniometer (KYOWA DM-701) is used to determine the degree of both the hydrophilicity and the hydrophobicity of the surface by measuring the static contact angles between a deionized water droplet (of 0.4-5 μL volume, preferably of 2 μL volume) and the surface.

EXAMPLE 2

Preparation of Textured Polycarbonate Surfaces

Bisphenol A polycarbonate plates [2,2-bis(p-hydroxyphenyl) propane] of 3 mm thickness made by Juliet Company were used. The bisphenol A 2,2-bis(p-hydroxyphenyl) based polycarbonate plates were cleaned with soap and then sonicated for 15 minutes in a mixture of isopropyl alcohol and deionized water. The cleaned samples were left to dry at ambient conditions for three hours and then immersed in dichloromethane solvent for a few seconds (~2 seconds) at room temperature. This is important as at longer immersions (>3 seconds) the glass will become opaque. The samples were then removed from the solvent and immediately exposed to acetone vapor for 1, 2, and 4 minutes at 33° C. In some embodiments, after removal from dichloromethane the samples are immediately immersed in water and subsequently exposed to acetone vapor. The acetone vapor may pass through a 1 cm×1 cm squared outlet, for 1, 2, and 4 minutes where the liquid acetone temperature is maintained at 33° C. A 25 mL cylindrical glass is used in the setup which evolves and/or evaporates acetone in the vertical direction towards the polycarbonate surface. After exposure to the acetone vapor the polycarbonate sheet is removed, cleaned with water, and left to dry at ambient room temperature. The exposure time plays a crucial role in the polycarbonate crystallization process. Thus, polycarbonate sheets are exposed to acetone vapor for different periods of time in order to investigate the effect of time on the surface texture characteristics, such as size, density and distance of the generated spherules and gaps. Table 1 is a summary of the experimental parameters of the solid-vapor interface method of the present disclosure in the preparation of textured polycarbonate glass by immersion (2 seconds) in pure liquid $CH_2Cl_2$, and exposure to acetone vapor.

TABLE 1

Experimental parameter of solid-vapor interface method of preparing textured polycarbonate surfaces

| Designation | Acetone Exposure Time |
|---|---|
| B1 | 1 minute |
| B2 | 2 minutes |
| B4 | 4 minutes |

EXAMPLE 3

Preparation of Tetraethyl Orthosilicate (TEOS) and 1,1,1,3,3,3-Hexamethyldisilazane (HMDS) Sol Gel and Coated Textured Polycarbonate Surfaces After texturing of the polycarbonate sheets, a hydrophobic and transparent TEOS/HMDS sol gel was dip coated onto the top of the polycarbonate glass textured surface. The pH value for deionized water was adjusted to 0.5 by adding 4-5 drops of HCl solution. Tetraethyl orthosilicate (TEOS) was hydrolyzed with acidic deionized water at a fixed molar ratio of TEOS:$C_2H_5OH$:$H_2O$ of 1:48:4 (pH=0.5) at 70° C. with vigorous stirring for 2 h, followed by the addition of 1,1,1,3,3,3-hexamethyldisilazane (HMDS) at a HMDS/TEOS ratio equal to 2 in 20 parts (1 drop at a time). The sequential addition of HMDS proceeded for 3 hours, optionally under sonication, with each successive addition being placed into the sol at different positions.

In some embodiments, upon the fourth or fifth addition of HMDS and the sonication of the sol, part of the sol was transformed into a transparent jelly. In this instance, the addition of HMDS is halted and the transparent jelly is retransformed into transparent sol when additional $C_2H_5OH$ ($C_2H_5OH$/TEOS=24) is added over 1-2 hours. In addition to the fixed 3 hours, this period of 1-2 hours was required to break up the transparent jelly. Subsequently, HMDS continued to be added until the end of the procedure and the transparent jelly was found to no longer be present. In some embodiments, to obtain an ideal superhydrophobic sol gel, while maintaining transparency as high as possible, further $C_2H_5OH$ ($C_2H_5OH$/TEOS=6) was added to the sol gel at the end of the addition of HMDS. The prepared sol gels were then aged in a refrigerator at 20° C. for 72 hours. The prepared sol gel was subsequently dip coated onto the polycarbonate glass substrates for 5 seconds. Heat treatment at 100-200° C. for 2 hours was used to repel the excess ethanol and stabilize the film.

EXAMPLE 4

Atomic Force Microscopy (AFM) Studies of Polycarbonate Textured Surfaces

Figure 2:
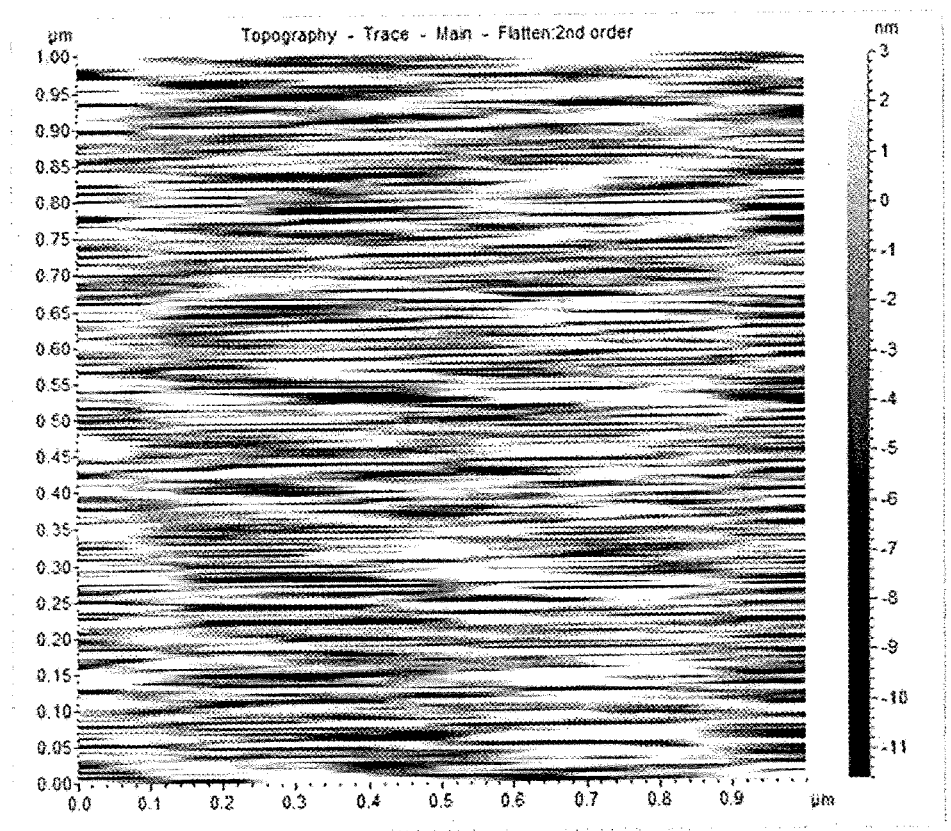
FIG. 2 is a 2D second order flattened topography micrograph of a smooth untreated polycarbonate glass surface.
Figure 3:
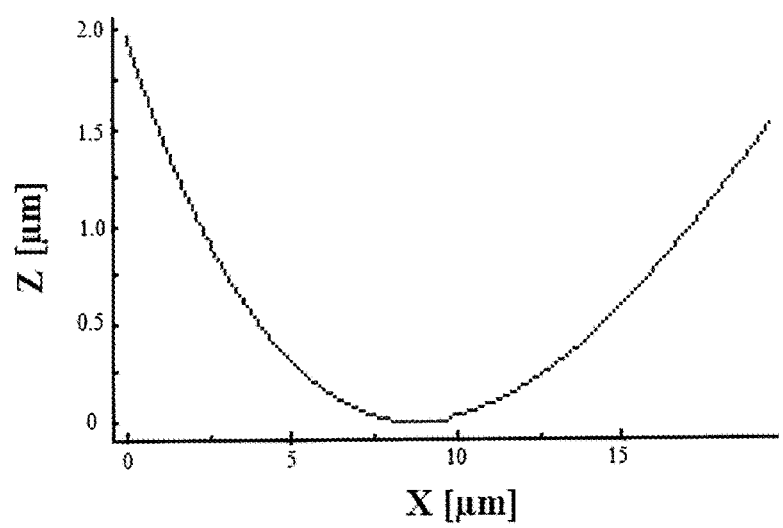
FIG. 3 is a 2D AFM line profile of a smooth untreated polycarbonate glass surface
Figure 4:
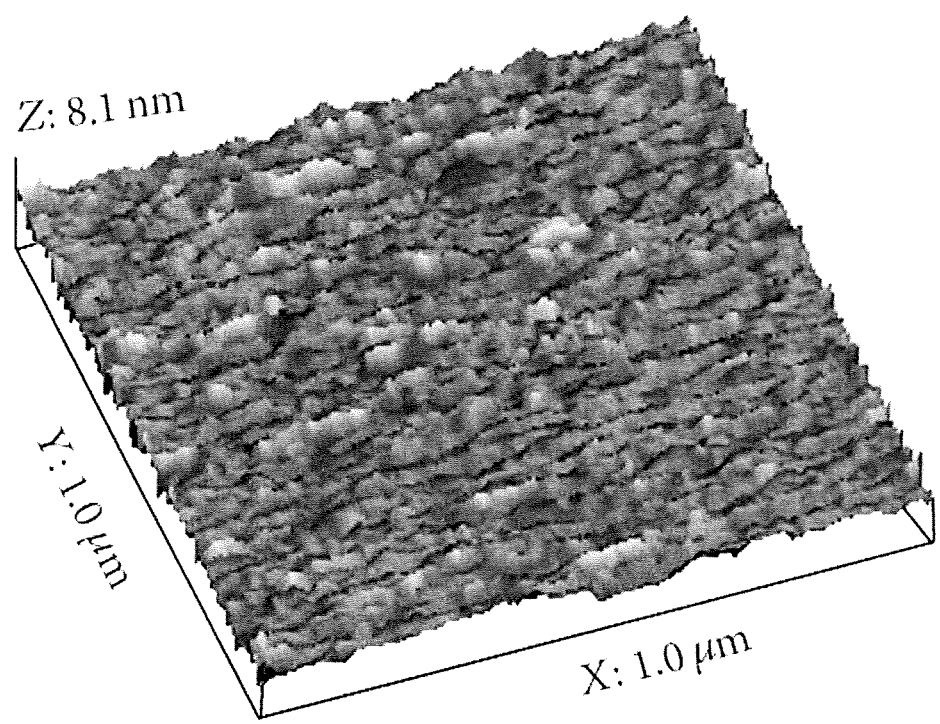
FIG. 4 is a 3D AFM topography image of a smooth untreated polycarbonate glass surface after ultrasonication for 15 minutes in isopropyl alcohol on a 1.0 μm scale.

Atomic force microscopy (AFM) scans were taken for smooth polycarbonate glass surfaces at a 20 μm scale. FIG. 1 shows the 3D AFM topography image of smooth polycarbonate glass surfaces. FIG. 2 presents the 2D second order flattened topography micrograph of the smooth untreated polycarbonate surface. FIG. 3 shows the 2D AFM line profile of the smooth untreated polycarbonate surfaces. FIG. 4 shows the 3D AFM topography image of untreated polycarbonate glass after ultrasonication for 15 minutes in isopropyl alcohol on a 1 μm scale demonstrating a smooth surface with very low surface roughness, as can be noted from the z-scale (8.1 nm). In all instances, the untreated surface appears slightly curved without any kind of texture on the surface of the polycarbonate sheet.

Figure 5:
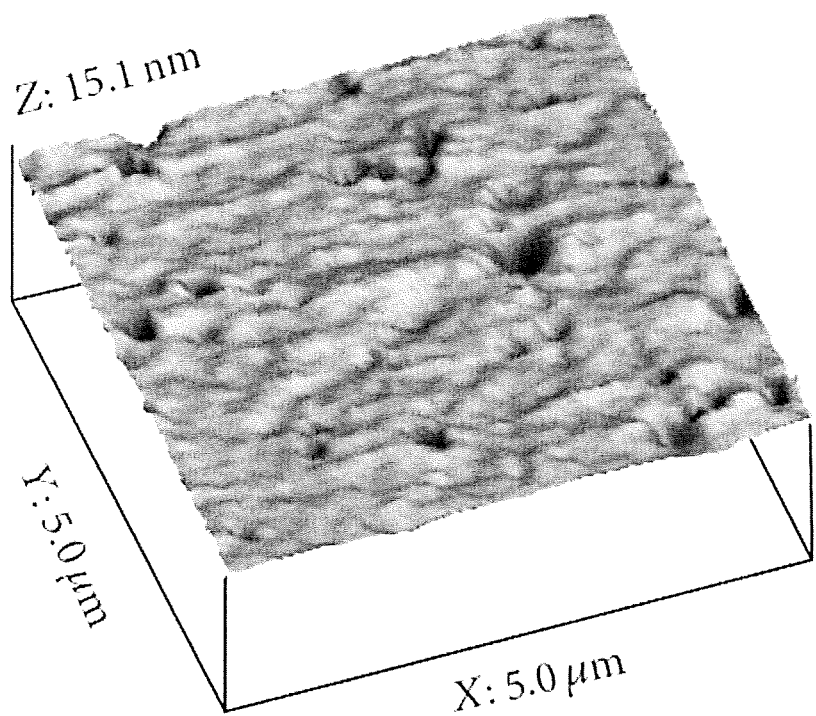
FIG. 5 is a 3D AFM topography image of a polycarbonate glass surface after immersing in dichloromethane for 2 seconds.
Figure 6:
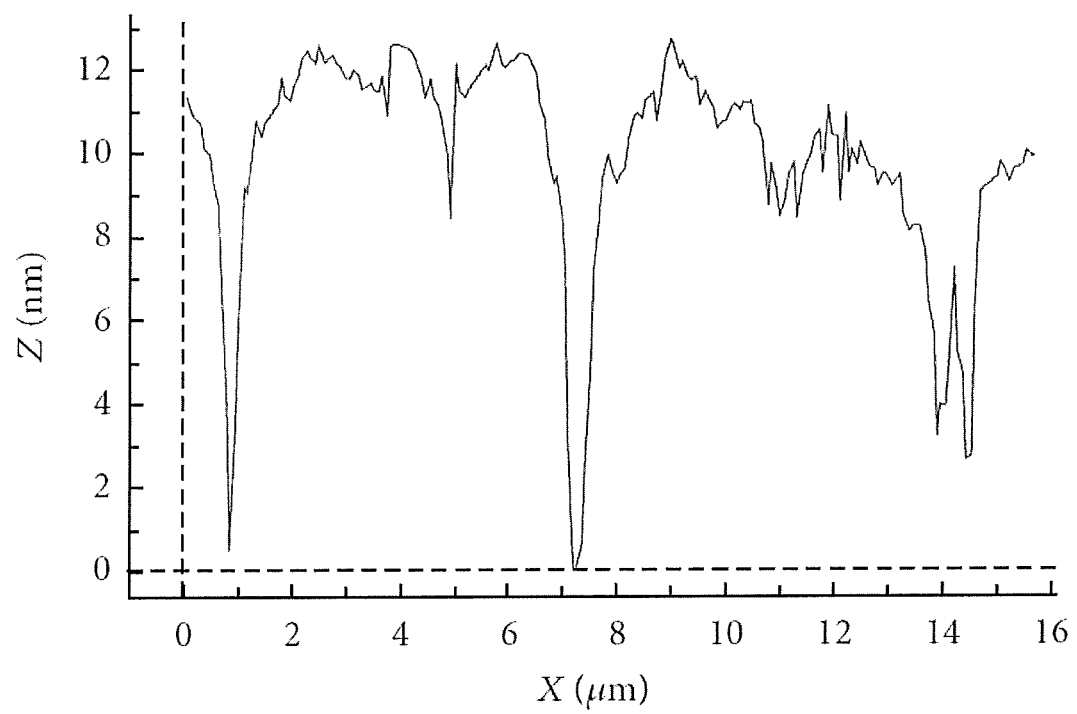
FIG. 6 is a line profile taken through an AFM topography image of a polycarbonate glass surface after immersing in dichloromethane for 2 seconds across pores.
Figure 7:
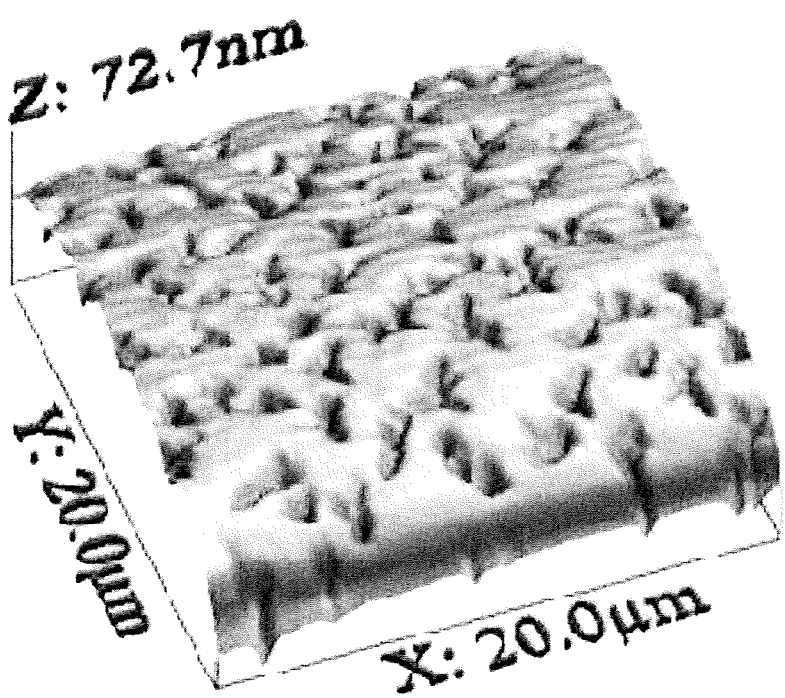
FIG. 7 is a 3D AFM micrograph at 20 μm scale of a polycarbonate glass surface after immersing in dichloromethane for 2 seconds.
Figure 8:
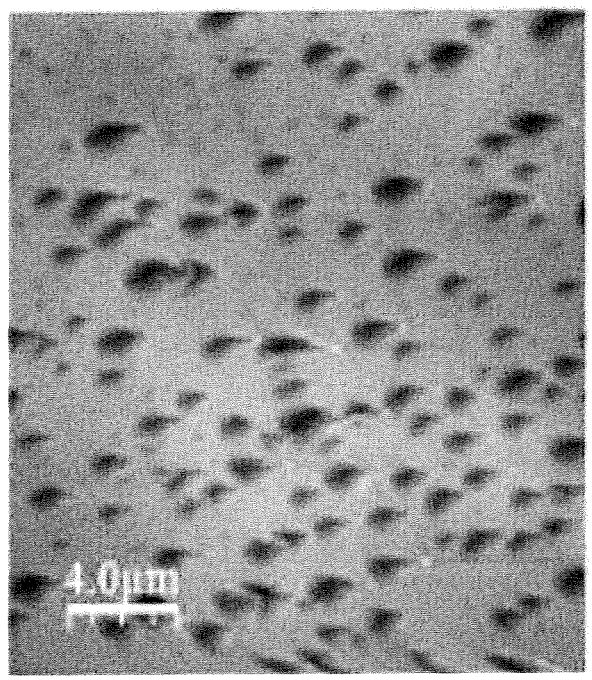
FIG. 8 is a 2D AFM micrograph at 20 μm scale of a polycarbonate glass surface after immersing in dichloromethane for 2 seconds.
Figure 9:
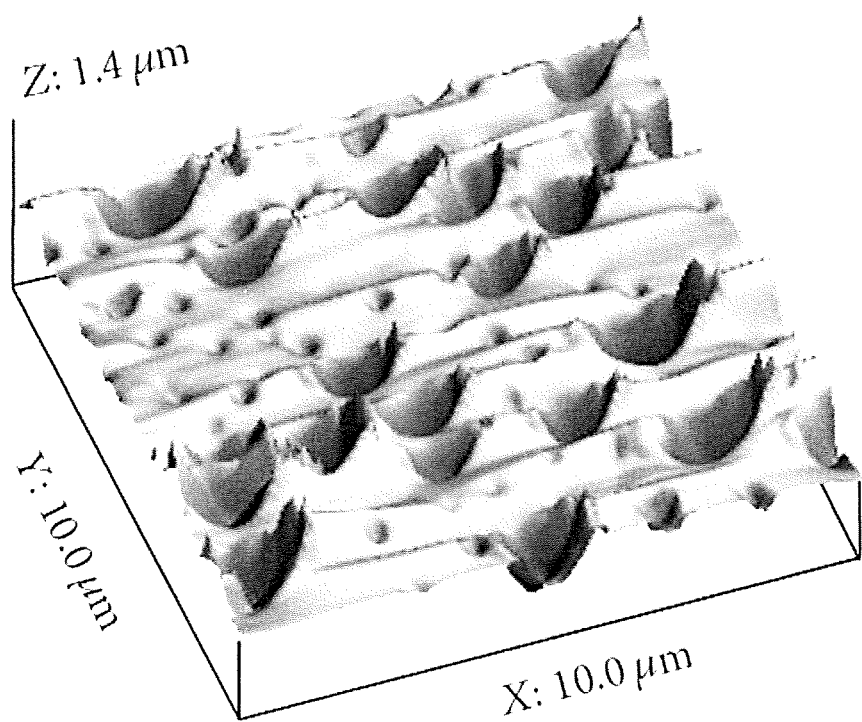
FIG. 9 is a 3D AFM topography image of a polycarbonate glass surface after immersing in dichloromethane for 5 seconds.

AFM scans were carried out on polycarbonate surfaces immersed in dichloromethane ($CH_2Cl_2$) for 2 seconds up to 5 seconds. FIG. 5 shows the 3D AFM topography image of polycarbonate glass after immersing in dichloromethane for 2 seconds. It can be noted that the surface shows a nonuniform nanoporous morphology with unaffected areas in between. FIG. 6 shows a line profile taken through FIG. 5 across pores allowing one to obtain quantitative information of the topographical details. The line profile demonstrates main pores with depth in the range of 10-12 nm and maximum surface width of 2 μm. The distance between the pores is in the range of 4 μm. The line profile also shows the initiation of infant pores with smaller widths of 183-600 nm and shallower depths that do not exceed 5 nm. FIG. 7 shows the 3D AFM micrograph at 20 μm scale of polycarbonate glass after immersing in dichloromethane for 2 seconds. FIG. 8 shows the 2D AFM micrograph at 20 μm scale of polycarbonate glass after immersing in dichloromethane for 2 seconds. FIG. 9 shows the 3D AFM topography image of polycarbonate glass after immersing in dichloromethane for 5 seconds. It is noted that beyond 2 seconds large micropores begin to develop as shown in the AFM image and likely significantly decreasing the polycarbonate transmittance.

Figure 10:
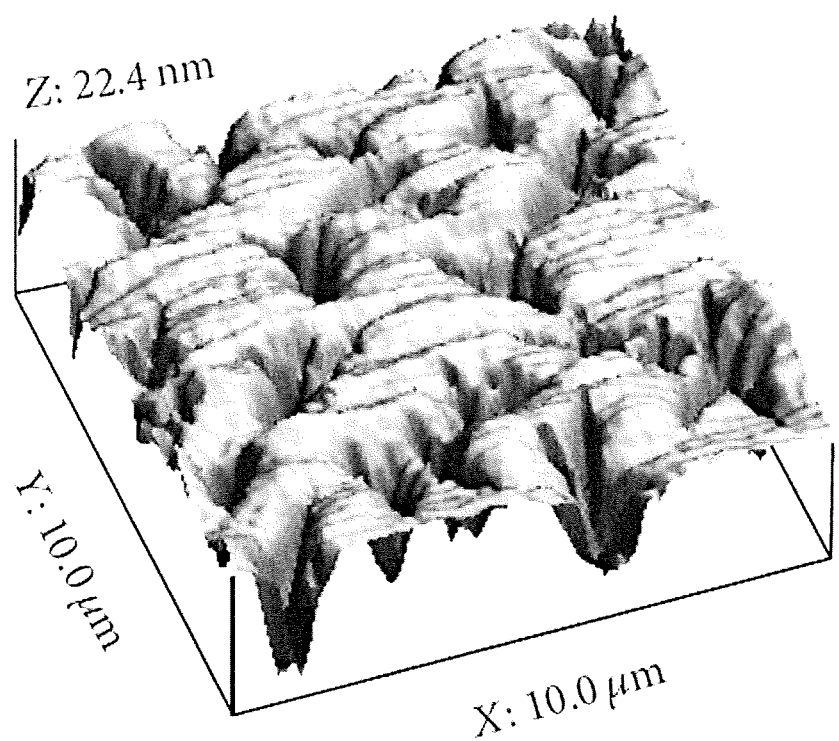
FIG. 10 is a 3D topography AFM image of a polycarbonate glass surface after immersion for 2 seconds in dichloromethane and exposure for 1 minute to acetone vapors at 10 μm scale.
Figure 11A:
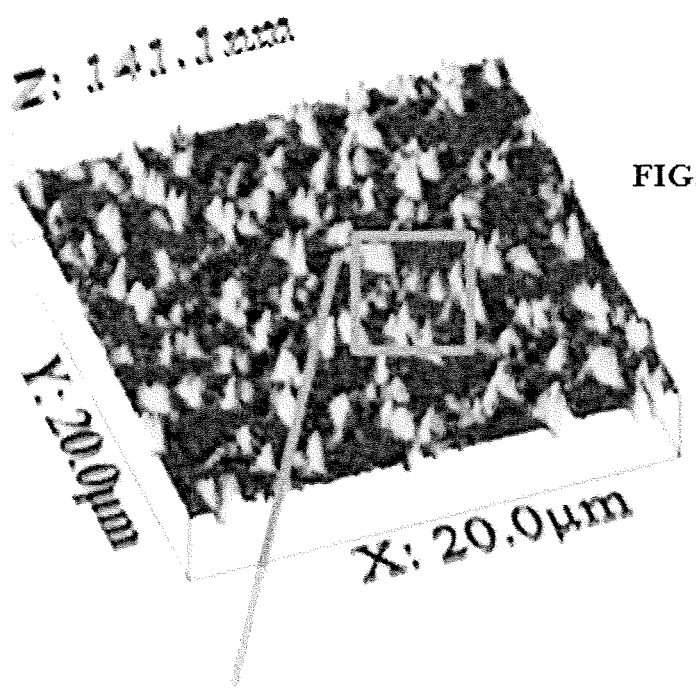
FIG. 11A is a 3D topography AFM image of a polycarbonate glass surface after immersion for 2 seconds in dichloromethane and exposure for 1 minute to acetone vapors at 20 μm scale.
Figure 11B:
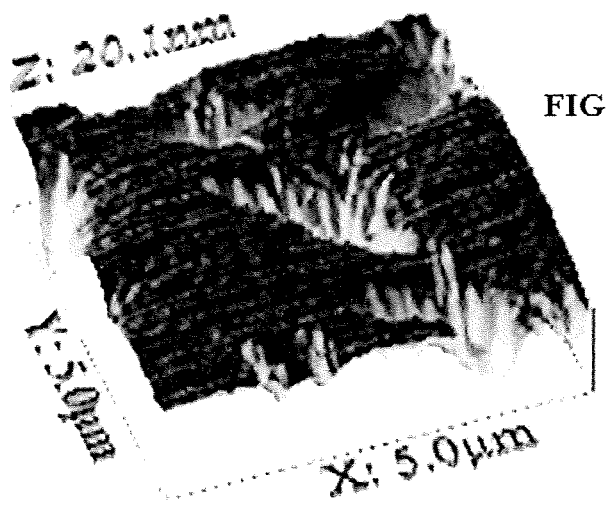
FIG. 11B is a 3D topography AFM image of a polycarbonate glass surface after immersion for 2 seconds in dichloromethane and exposure for 1 minute to acetone vapors at 5 μm scale.
Figure 12:
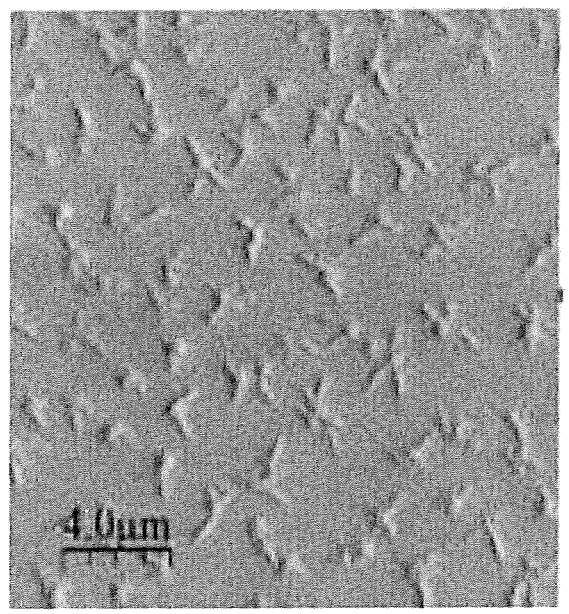
FIG. 12 is a 2D topography AFM micrograph of a polycarbonate glass surface after immersion for 2 seconds in dichloromethane and exposure for 1 minute to acetone vapors at 20 μm scale.
Figure 13:
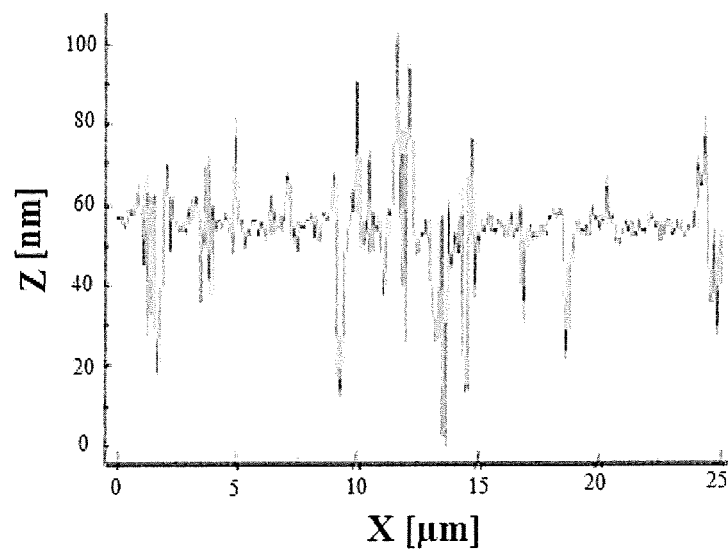
FIG. 13 is a line profile texture micrograph taken through an AFM micrograph of a polycarbonate glass surface after immersion for 2 seconds in dichloromethane and exposure for 1 minute to acetone vapors at 20 μm scale.
Figure 14:
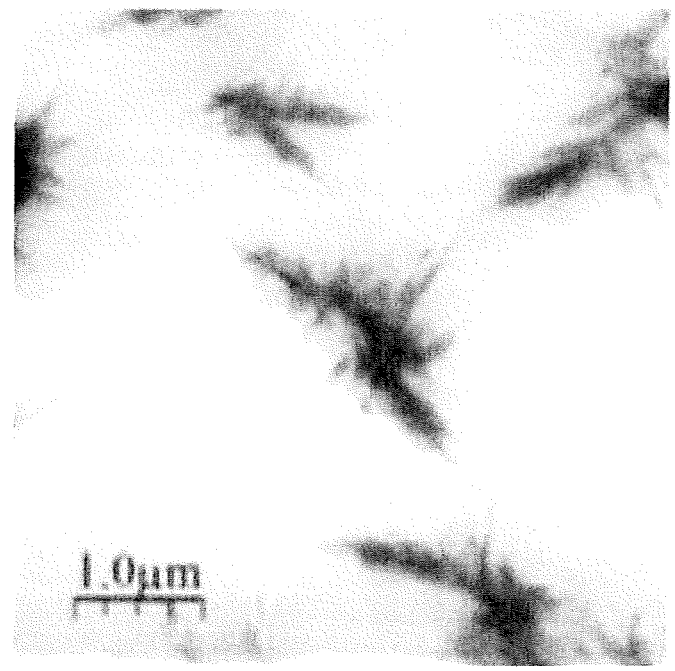
FIG. 14 is a 2D topography AFM micrograph of a polycarbonate glass surface after immersion for 2 seconds in dichloromethane and exposure for 1 minute to acetone vapors at 5 μm scale.
Figure 15:
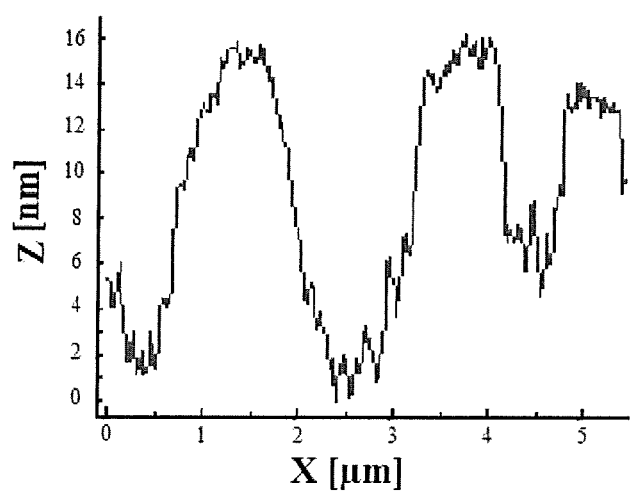
FIG. 15 is a line profile texture micrograph taken through an AFM micrograph of a polycarbonate glass surface after immersion for 2 seconds in dichloromethane and exposure for 1 minute to acetone vapors at 5 μm scale.

FIG. 10, FIG. 11A, and FIG. 11B show the 3D topography AFM image of the polycarbonate after immersion for 2 seconds in dichloromethane and exposure for 1 minute to acetone vapors at 10 μm scale, 20 μm scale, and 5 μm scale respectively. FIG. 12 is the 2D topography AFM micrograph at 20 μm scale. FIG. 13 is the line profile texture micrograph taken through FIG. 12. FIG. 14 is the 2D topography AFM micrograph at 5 μm scale. FIG. 15 is the line profile texture micrograph taken through FIG. 14. At this first stage (1 minute exposure) the spherules are still small and have not expanded vertically significantly yet. The AFM data at the 20 μm scale scan exhibits a uniformly textured surface comprising pores of sizes ranging from 370-971 nm in diameter and a maximum depth of 103 nm. Upon magnification to the 5 μm scale, the pores appear patterned with a hill-like structure as the surface between them.

However, after 2 minutes of exposure complete micrometer size spherules are observed in the 3D AFM topographic image. The surface morphology further reveals the presence of areas of high posts follow by relatively unaffected void areas which close up after the 2 minute exposure limit. Voids between the spherules may be necessary to allow the surface to maintain sufficient optical transmittance.

Figure 16A:
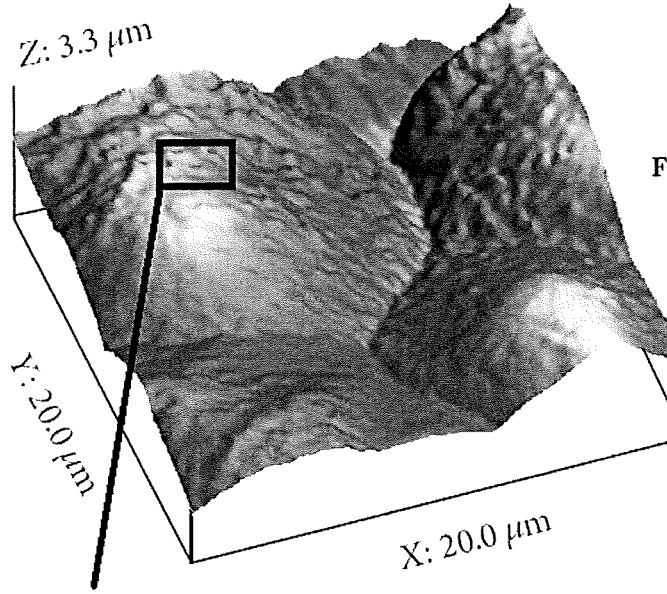
FIG. 16A is a 3D topography AFM image of a polycarbonate glass surface after immersion for 2 seconds in dichloromethane and exposure for 4 minutes to acetone vapors at 20 μm scale.
Figure 16B:
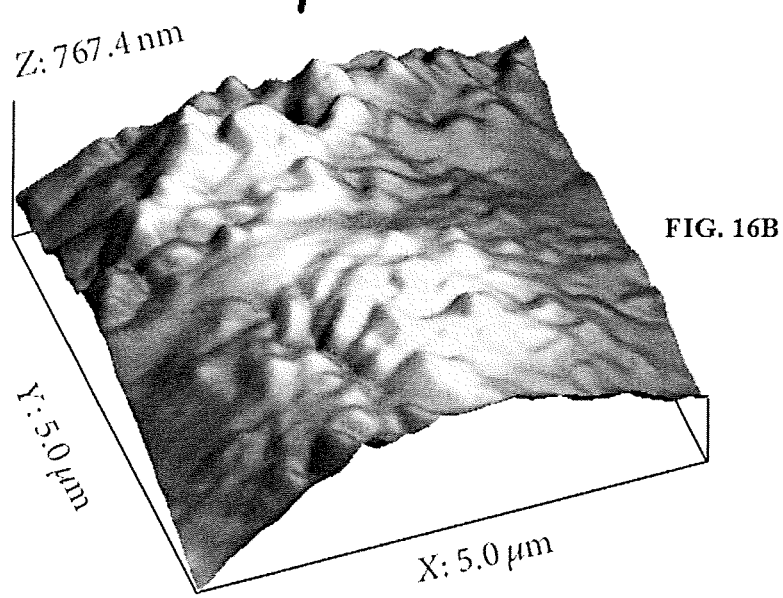
FIG. 16B is a 3D topography AFM image of a polycarbonate glass surface after immersion for 2 seconds in dichloromethane and exposure for 4 minutes to acetone vapors at 5 μm scale.
Figure 17:
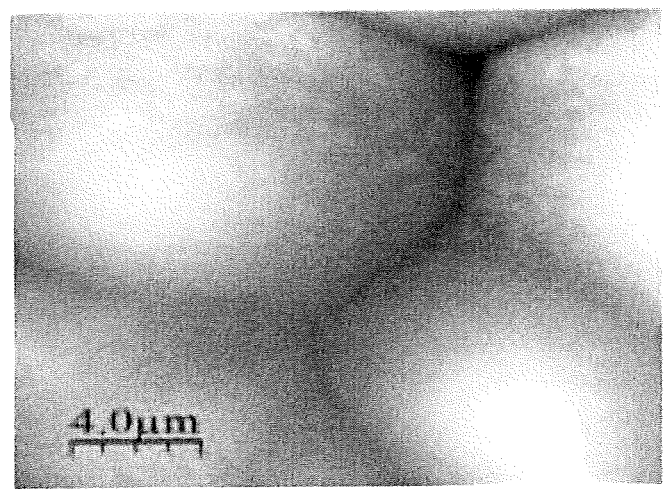
FIG. 17 is a 2D topography AFM micrograph of a polycarbonate glass surface after immersion for 2 seconds in dichloromethane and exposure for 4 minutes to acetone vapors at 20 μm scale.
Figure 18:
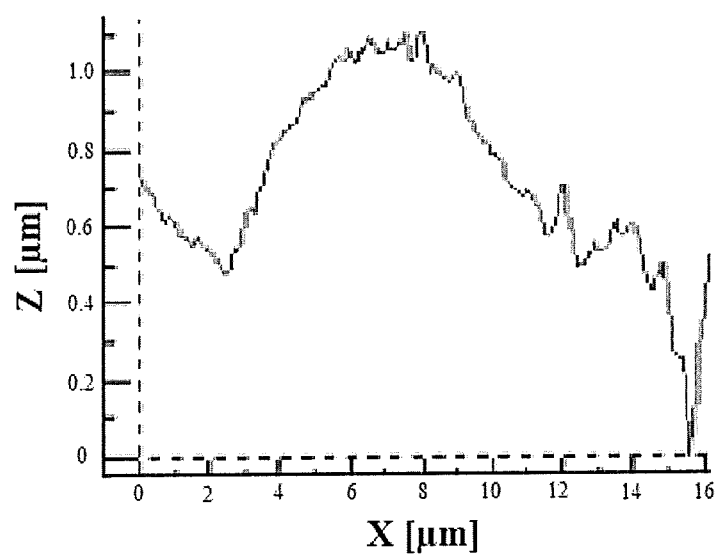
FIG. 18 is a line profile texture micrograph taken through an AFM micrograph of a polycarbonate glass surface after immersion for 2 seconds in dichloromethane and exposure for 4 minutes to acetone vapors at 20 μm scale.
Figure 19:
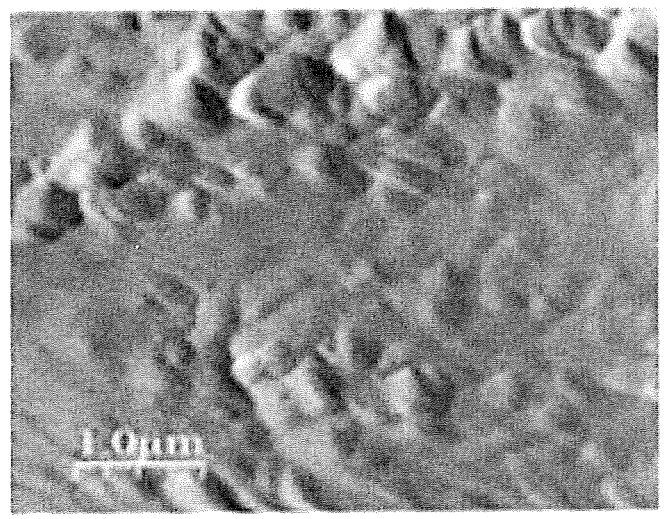
FIG. 19 is a 2D topography AFM micrograph of a polycarbonate glass surface after immersion for 2 seconds in dichloromethane and exposure for 4 minutes to acetone vapors at 5 μm scale.
Figure 20:
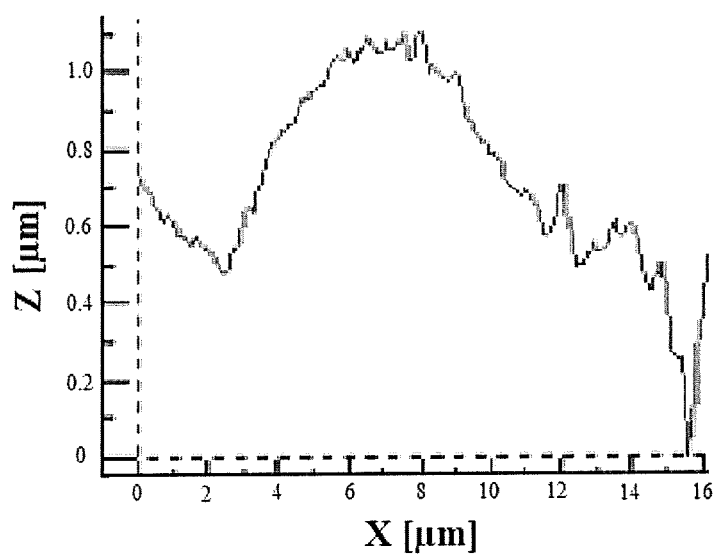
FIG. 20 is a line profile texture micrograph taken through an AFM micrograph of a polycarbonate glass surface after immersion for 2 seconds in dichloromethane and exposure for 4 minutes to acetone vapors at 5 μm scale.

Several AFM images are scanned at different areas on the textured polycarbonate glass surface after 2 seconds immersed in dichloromethane and 4 minute exposure to acetone vapor. FIG. 16A, and FIG. 16B show the 3D topography AFM image of the polycarbonate after immersion for 2 seconds in dichloromethane and exposure for 4 minutes to acetone vapors at 20 μm scale and 5 μm scale respectively. FIG. 17 is the 2D topography AFM micrograph at 20 μm scale. FIG. 18 is the line profile texture micrograph taken through FIG. 17. FIG. 19 is the 2D topography AFM micrograph at 5 μm scale. FIG. 20 is the line profile texture micrograph taken through FIG. 19. Increasing exposure time of the polycarbonate glass for the acetone vapors will cause a further increase in the size of the spherules, and hence reduce the path for light transmittance. It can be noticed that the spherules are closing up while no significant change in spherule height is observed as compared to the 2 minute exposure. The micrographs show clearly that there is texture over the surface of the polycarbonate after chemical treatment. In the 20 μm micrograph, complete coverage of the surface with large spherules of 13 μm in width and 1.4 μm in height are observed with fine nanoostructures on top as noted in the line profile (FIG. 18). The spherules' surface is textured and covered with fibers. At the 5 μm scale the micrograph reveals the fibers having a diameter of 459 nm and a height of 157 nm.

EXAMPLE 5

Light Transmittance of Polycarbonate Textured Surfaces

Figure 21:
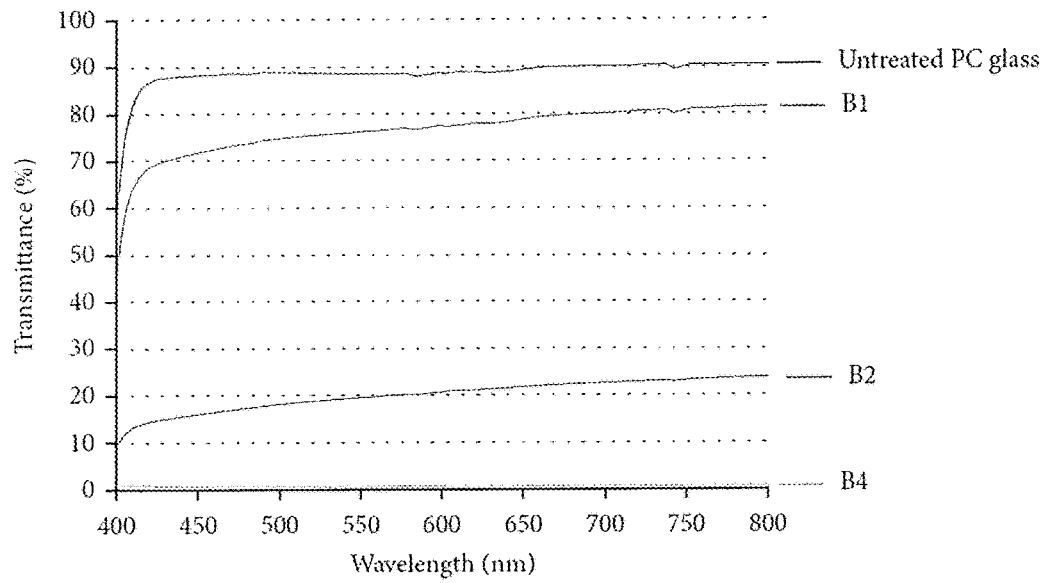
FIG. 21 shows all the transmittance curves for the four samples including an untreated polycarbonate glass surface and a polycarbonate glass surface after immersion for 2 seconds in dichloromethane and exposure for 1 minute ($B_1$), 2 minutes ($B_2$) and 4 minutes ($B_4$) to acetone vapors.
Figure 22:
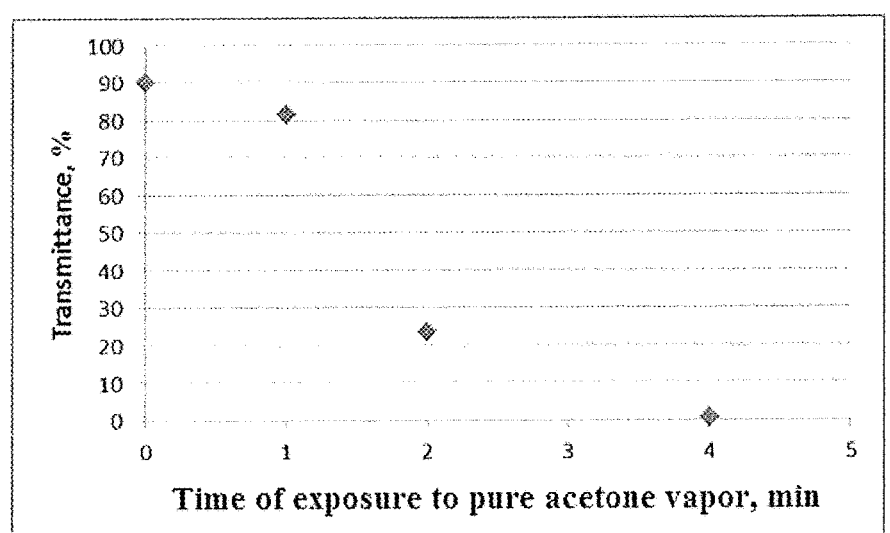
FIG. 22 is a graphical representation depicting that by increasing the exposure time to the acetone vapor (1 minute, 2 minutes, 4 minutes), the transmittance of a patterned polycarbonate glass surface decreases.

Polycarbonate sheets as received and those treated are scanned between 400 nm to 800 nm (visible region) by UV-Vis to measure its transmittance. FIG. 21 shows all the transmittance curves for the four treated samples. The descending arrangement of the samples according to exposure time to the acetone vapor is $B_4 > B_2 > B_1 >$ untreated sample. The descending arrangement of the transmittance values for the samples is untreated sample$>B_1>B_2>B_4$. It can be inferred that the transmittance value is inversely proportional to the exposure time to acetone vapor. FIG. 22 depicts that by increasing the exposure time to the acetone vapor, the transmittance of the patterned surface decreases. The average transmittance of the untreated polycarbonate glass in the visible region was found to be 90.20%. The optical transmittance was 80% for the 1 minute exposure to acetone vapors versus 26% for the 2 minute exposure to acetone vapors. After 4 minutes of treatment with acetone vapors the optical transmittance was reduced to just a few percent.

EXAMPLE 6

Contact Angle Studies of Textured Polycarbonate Surfaces

Figure 23:
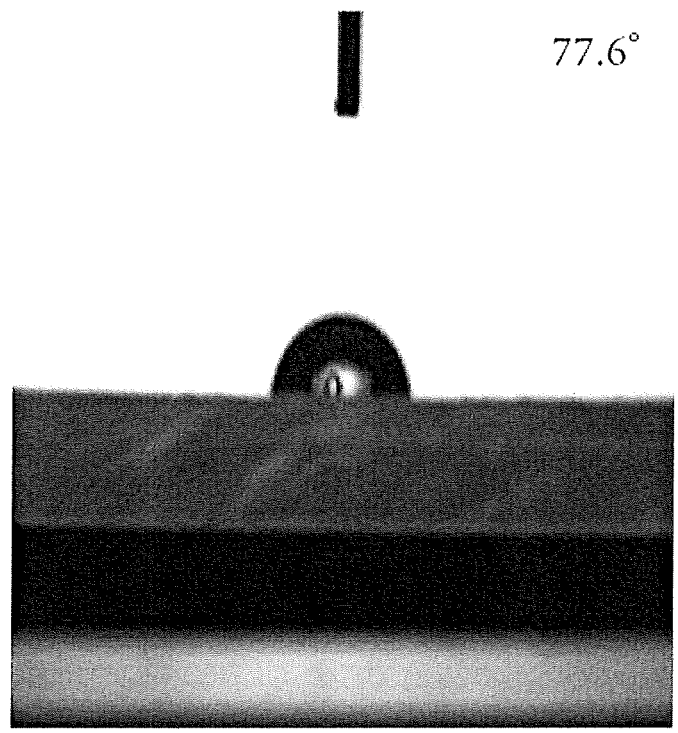
FIG. 23 is an optical microimage of a water droplet on an untreated sample polycarbonate glass surface for contact angle measurements.
Figure 24:
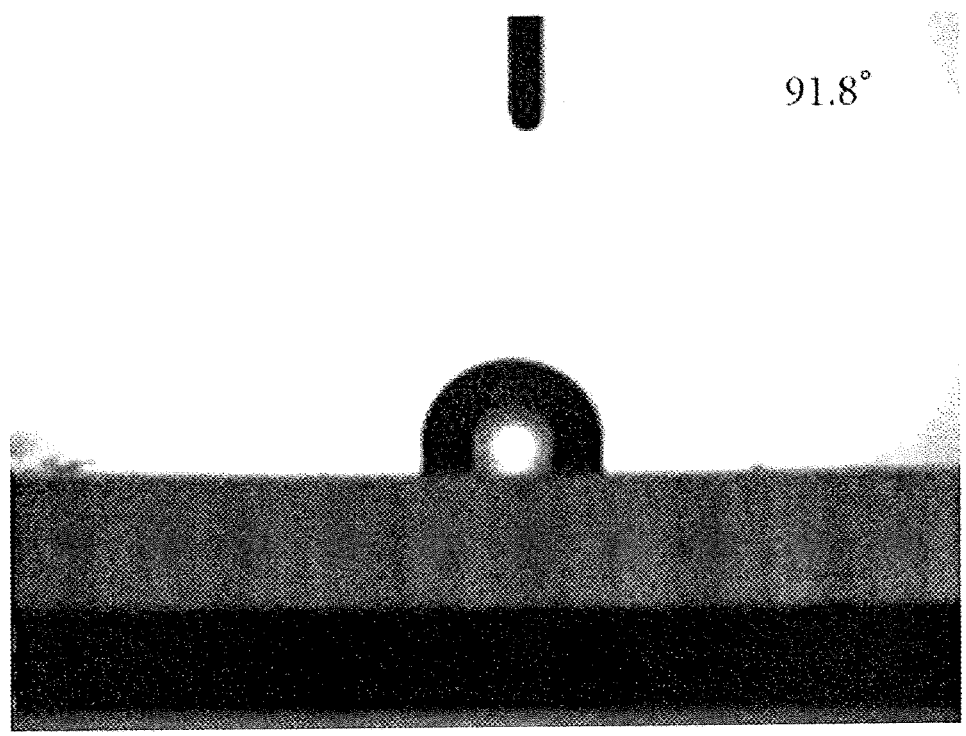
FIG. 24 is an optical microimage of a water droplet on a sample polycarbonate glass surface immersion for 2 seconds in dichloromethane for contact angle measurements.

The contact angle of the untreated polycarbonate surface is measured by dropping a deionized water droplet over the surface and is measured using a goniometer. Different areas of the surface were taken into consideration during the measurements. FIG. 23 shows that it was found that the average contact angle is 77.6°; indicating the slight hydrophilicity of the smooth polycarbonate surface. FIG. 24 shows that the contact angle after immersion of polycarbonate glass in dichloromethane the resulting contact angle was 91.8° compared to 77.6° for the untreated polycarbonate glass. Table 2 presents the determined contact angles for prepared treated samples.

TABLE 2

Average contact angles of different prepared textured polycarbonate surface samples

| Sample | Acetone Exposure Time (min) | Contact Angle (deg.) | Average Contact Angle (deg.) |
|---|---|---|---|
| $B_1$ (area 1) | 1 | 80.3 | 79 |
| $B_1$ (area 2) |   | 77.5 |   |
| $B_1$ (area 3) |   | 79.2 |   |
| $B_2$ (area 1) | 2 | 82.1 | 79.93 |
| $B_2$ (area 2) |   | 79.3 |   |
| $B_2$ (area 3) |   | 78.4 |   |
| $B_3$ (area 1) | 4 | 100.9 | 102.8 |
| $B_3$ (area 2) |   | 103.2 |   |
| $B_3$ (area 3) |   | 104.4 |   |

Figure 25:
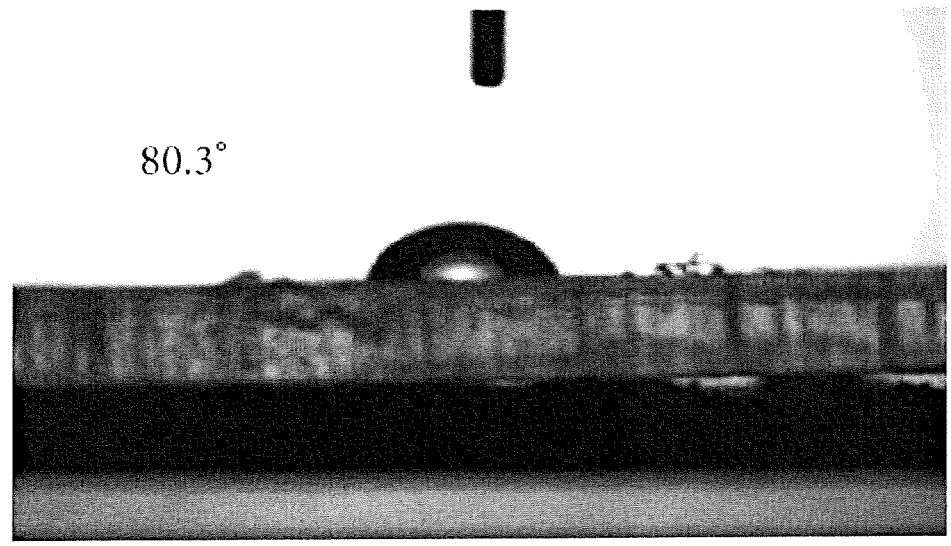
FIG. 25 is an optical microimage of a water droplet on a sample polycarbonate glass surface after immersion for 2 seconds in dichloromethane and exposure for 1 minute to acetone vapors for contact angle measurements.
Figure 26:
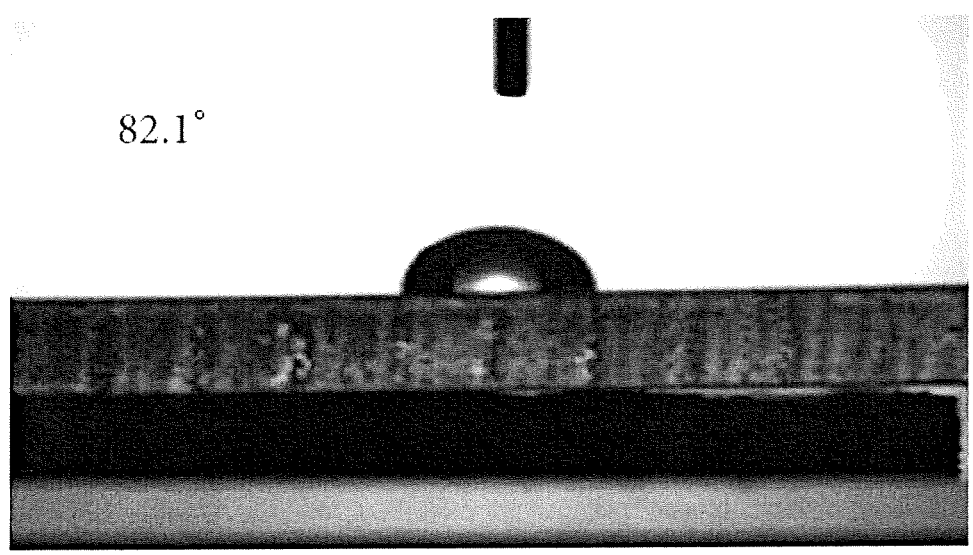
FIG. 26 is an optical microimage of a water droplet on a sample polycarbonate glass surface after immersion for 2 seconds in dichloromethane and exposure for 2 minutes to acetone vapors for contact angle measurements.
Figure 27:
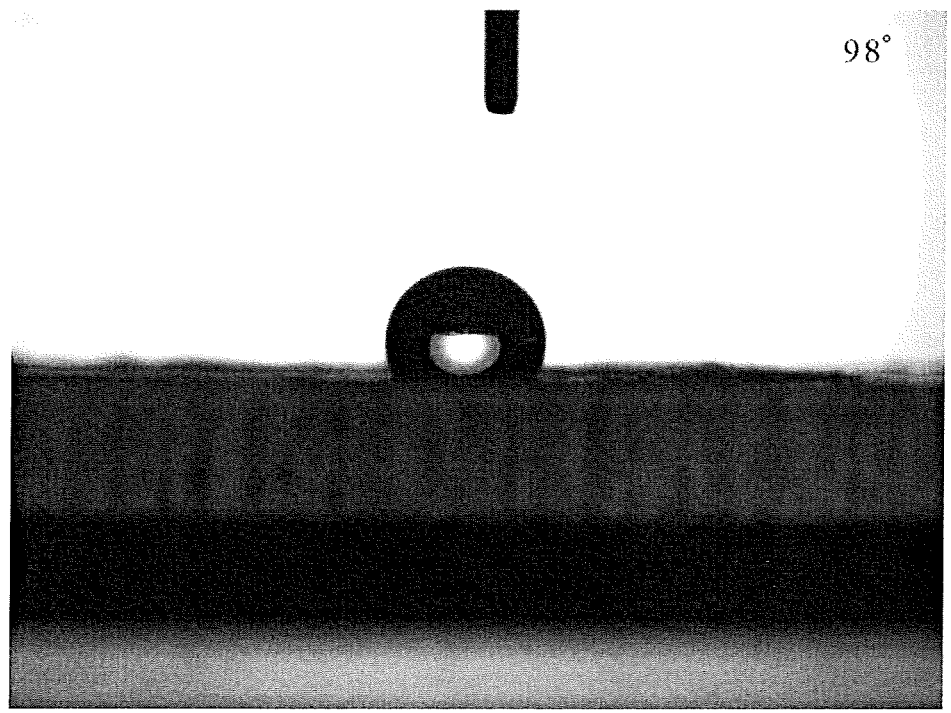
FIG. 27 is an optical microimage of a water droplet on a sample polycarbonate glass surface after immersion for 2 seconds in dichloromethane and exposure for 4 minutes to acetone vapors for contact angle measurements.

FIG. 25, FIG. 26, and FIG. 27 show the measurement of the contact angle for textured polycarbonate samples after immersion in dichloromethane for 2 seconds and subsequent exposure to pure acetone vapors for 1 minute, 2 minutes, and 4 minutes, respectively. From the above data, it can be extracted that by increasing the treatment time of the polycarbonate sample with the acetone vapor, the contact angle increases. Secondly, the average contact angle value increase slightly from 1 minute (~80.3°) to 2 minute (~82.1°) treatments with acetone vapor and then increased rapidly for the 4 minute treatment (>98°).

EXAMPLE 7

Fourier-Transform Infrared (FT-IR) Analysis and Roughness Root Mean Square (RMS) Values of Polycarbonate Textured Surfaces Fourier-transform Infrared (FT-IR) technique is used for the identification of the presence of chemical groups, functional, side and terminal groups. FT-IR technique is used to study the chemical structure of the polycarbonate surface before and after the treatment process. In addition, the technique gives an indication on the degree of crystallization of the surface after the treatment process through the peaks intensities values. The amorphous form of the polymer gives a relatively higher degree of freedom to the polymers tail motion. This permits the absorption of larger amounts of energy, and consequently, the performance of stronger vibrations, in the case of molecules or groups that have a dipole moment (asymmetric chemical structure) [Liang, G. G., et al., *Diallyl orthophthalate as a reactive plasticizer for* polycarbonate. Part 1: Uncured system. European Polymer Journal, 2008. 44(2): p. 366-375; and Atkins, P., *Paula J. Atkins' physical chemistry*. 2012, Oxford, N.Y.: Oxford University Press—each incorporated herein by reference in its entirety].

Figure 28:
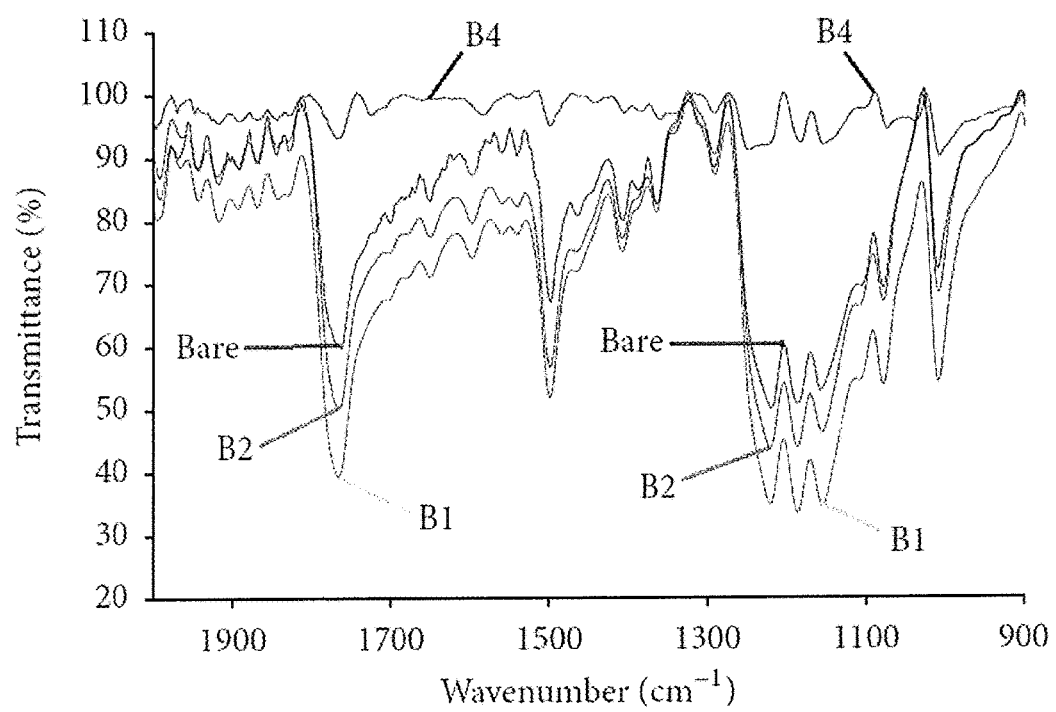
FIG. 28 is the Fourier-transform Infrared (FT-IR) spectra of the four samples including an untreated polycarbonate glass surface and a polycarbonate glass surface after immersion for 2 seconds in dichloromethane and exposure for 1 minute ($B_1$), 2 minutes ($B_2$) and 4 minutes ($B_4$) to acetone vapors.

FT-IR was carried out on all textured surfaces. FIG. 28 presents the FT-IR spectra of all the textured surfaces and the untreated polycarbonate surface. The analysis focuses on the wavelength at which the peak of the carbonyl, C═O, stretching mode appears. Before the exposure to acetone, the peak of the carbonyl stretching mode appears at 1766 cm$^{-1}$ (1766.8 cm$^{-1}$ for $B_1$, 1762.9 cm$^{-1}$ for $B_2$, and 1767.1 cm$^{-1}$ for $B_4$. The spectra are identical except for the decrease of the carbonyl peak intensities around 1766 cm$^{-1}$ indicating the phase transformation of the polymer from the amorphous phase, which allows a higher degree of freedom to the chains motion and bonds vibrations, to the crystalline phase, in which the molecules are tightly packed and consequently the vibrations and motions are restricted. Further, it indicates that the acetone interaction with the polycarbonate is a physical process as there is no new peak that emerges after the treatment process [de Oliveira, F. L. O., et al., Study on bisphenol-A polycarbonates samples crystallized by acetone vapor induction. Polymer bulletin, 2011. 67(6): p. 1045-1057; and Liu, C. K., C. T. Hu, and S. Lee, *Effect of compression and thickness on acetone transport in polycarbonate*. Polymer Engineering & Science, 2005. 45(5): p. 687-693; and Dybal, J., et al., *Ordered structures in polycarbonate studied by infrared and Raman spectroscopy, wide-angle X-ray scattering, and differential scanning calorimetry*. Macromolecules, 1998. 31(19): p. 6611-6619; and Paragkumar N, T., D. Edith, and J.-L. Six, *Surface characteristics of PLA and PLGA films*. Applied Surface Science, 2006. 253(5): p. 2758-2764—each incorporated herein by reference in its entirety].

Table 3 exhibits the roughness root mean square (RMS) values taken at a 5 μm scale for the prepared textured polycarbonate samples. The data shows that the RMS values calculated at the 5 μm scale illustrate that the sample treated with acetone vapor for 4 minutes has the highest surface roughness. By increasing the exposure time with acetone vapor, the polycarbonate surface gets more crystallized, pore depths increase, the compositions of the air-pockets begins, and the RMS values inversely increase with the decrease in the transmittance.

TABLE 3

Roughness root mean square (RMS) values of different prepared textured polycarbonate surface samples

| Scale (μm) | Smooth Polycarbonate | $B_1$ | $B_2$ | $B_4$ |
|---|---|---|---|---|
| 5 | 112 | 213 | 260 | 639.2 |
| Avg. T % | 90.20 | 81.33 | 23.67 | 0.60 |

EXAMPLE 8

Effect of Sol Gel Coating on Polycarbonate Textured Surfaces

Figure 29:
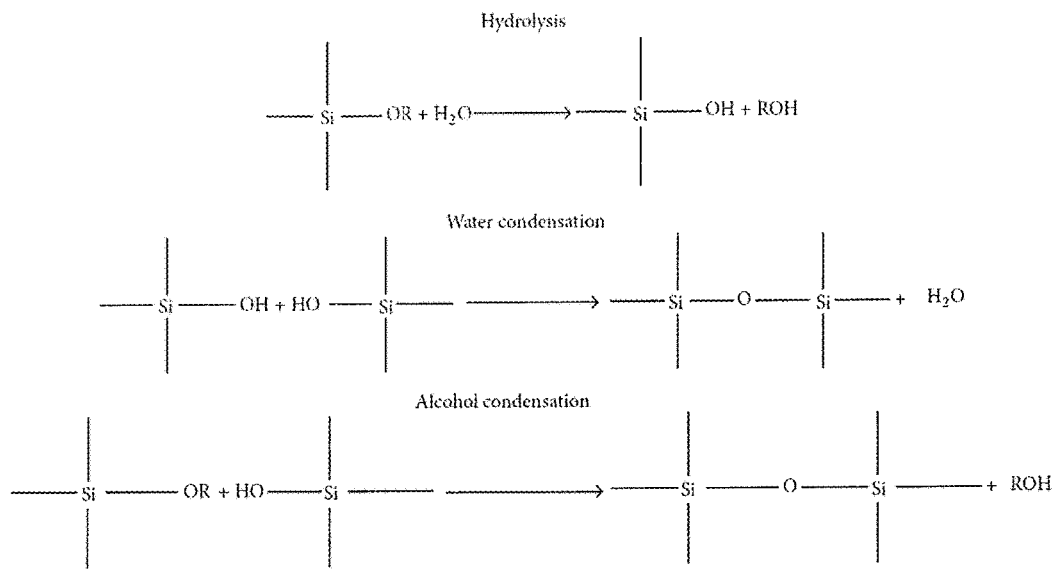
FIG. 29 is the equation for the hydrolysis of tetraethyl orthosilicate (TEOS)
Figure 30:
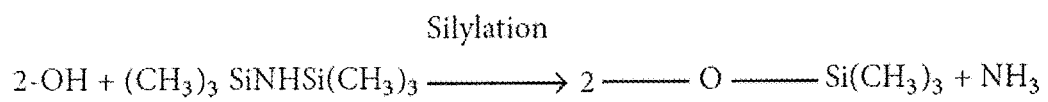
FIG. 30 is the equation for the reaction between a Si—OH functionality and 1,1,1,3,3,3-hexamethyldisilazane (HMDS) to form the hydrophobic bond.

Sol gel coating is well known to improve the surface properties of many different materials. Surface modification by the deposition of a transparent hydrophobic material on the rough surface to increase hydrophobicity has shown promise. In the case of photovoltaic cell applications the interest is in developing a superhydrophobic coating while maintaining high optical transmittance. FIG. 29 is the equation for the hydrolysis of tetraethyl orthosilicate (TEOS). FIG. 30 is the equation for the reaction between a Si—OH functionality and 1,1,1,3,3,3-hexamethyldisilazane (HMDS) to form the hydrophobic bond. With this aim, textured polycarbonate samples formed by treatment with dichloromethane and acetone vapor for 1 minute ($B_1$) and 2 minutes ($B_2$) were dip coated in a TEOS/HMDS sol gel.

Figure 31:
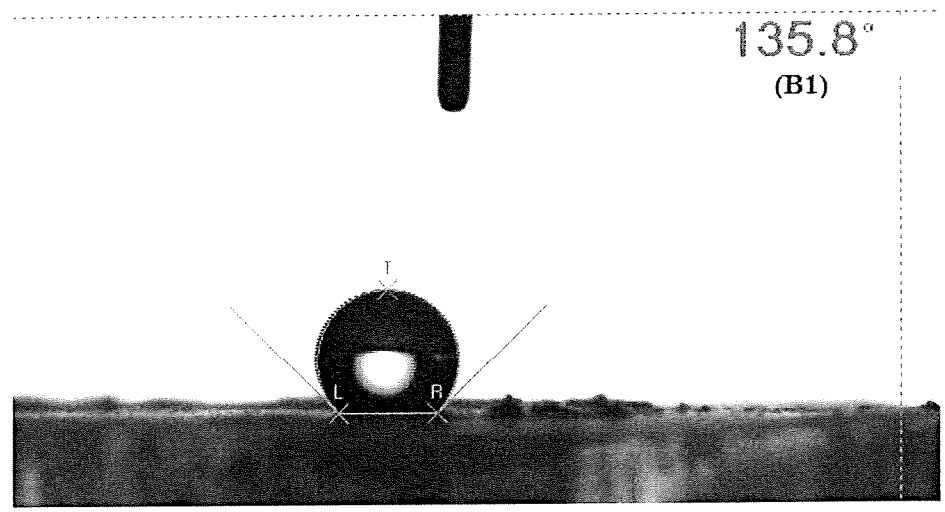
FIG. 31 is an optical microimage of a water droplet on a sample polycarbonate glass surface after immersion for 2 seconds in dichloromethane, exposure for 1 minute to acetone vapors and coating with a TEOS/HMDS sol gel for contact angle measurements.
Figure 32:
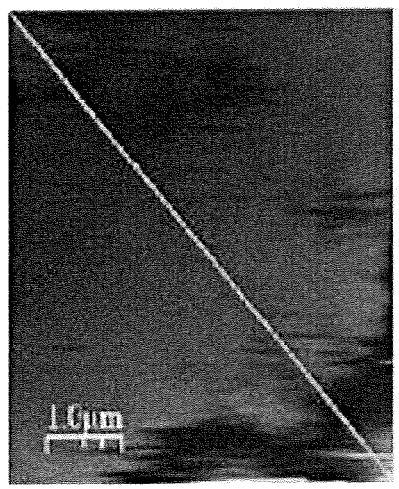
FIG. 32 is a 2D topography AFM micrograph of a polycarbonate glass surface after immersion for 2 seconds in dichloromethane, exposure for 1 minute to acetone vapors and coating with a TEOS/HMDS sol gel at 5 μm scale.
Figure 33:
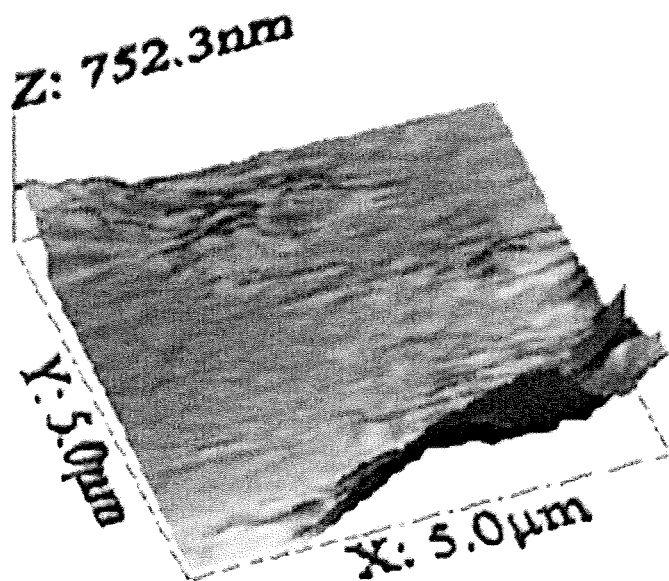
FIG. 33 is a 3D topography AFM micrograph image of a polycarbonate glass surface after immersion for 2 seconds in dichloromethane, exposure for 1 minute to acetone vapors and coating with a TEOS/HMDS sol gel at 5 μm scale.
Figure 34:
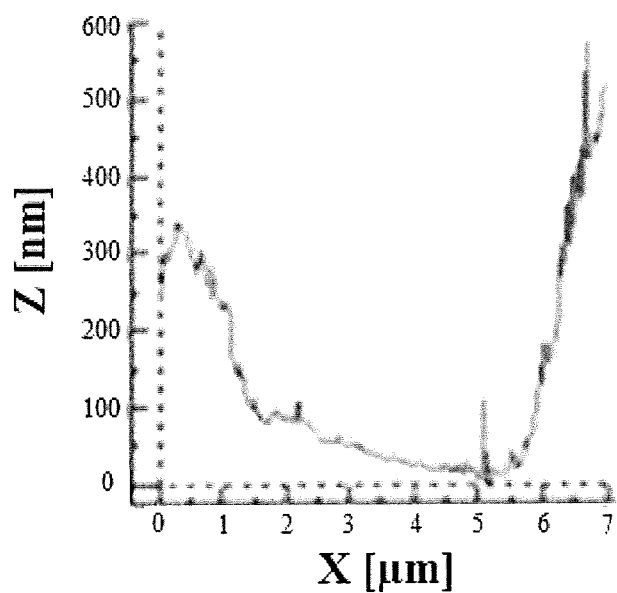
FIG. 34 is a line profile texture micrograph taken through an AFM micrograph of a polycarbonate glass surface after immersion for 2 seconds in dichloromethane, exposure for 1 minute to acetone vapors and coating with a TEOS/HMDS sol gel at 5 μm scale.
Figure 35:
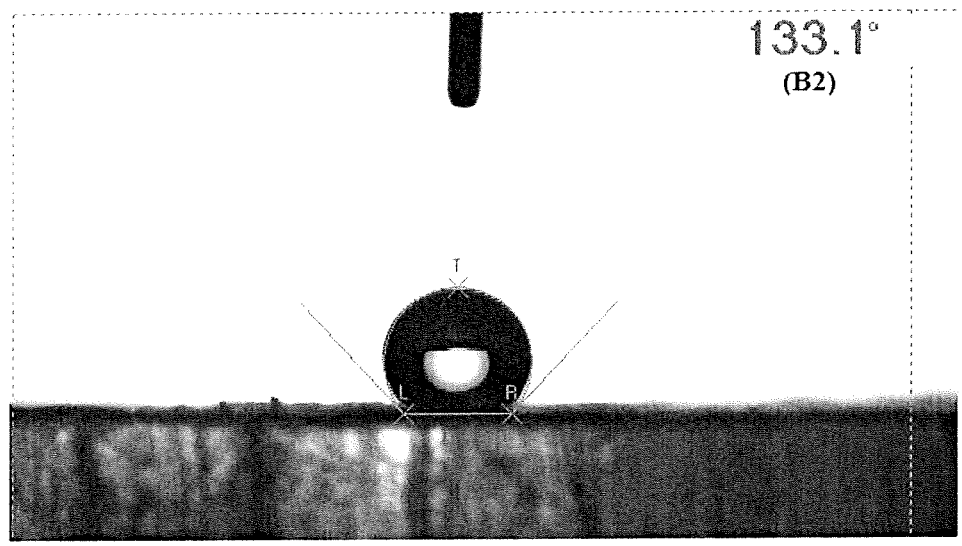
FIG. 35 is an optical microimage of a water droplet on a sample polycarbonate glass surface after immersion for 2 seconds in dichloromethane, exposure for 2 minutes to acetone vapors and coating with a TEOS/HMDS sol gel for contact angle measurements.
Figure 36:
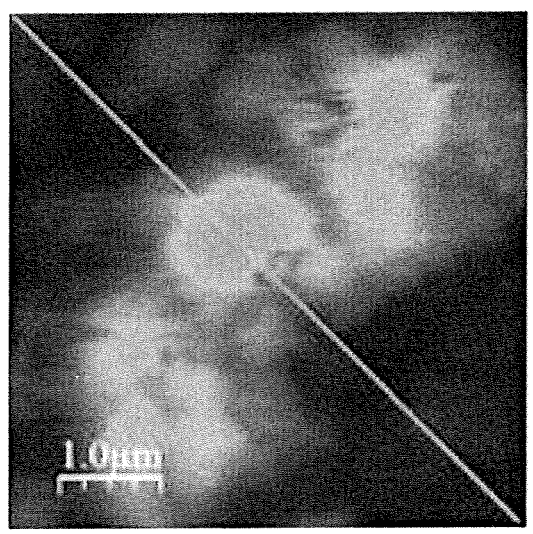
FIG. 36 is a 2D topography AFM micrograph of a polycarbonate glass surface after immersion for 2 seconds in dichloromethane, exposure for 2 minutes to acetone vapors and coating with a TEOS/HMDS sol gel at 5 μm scale.
Figure 37:
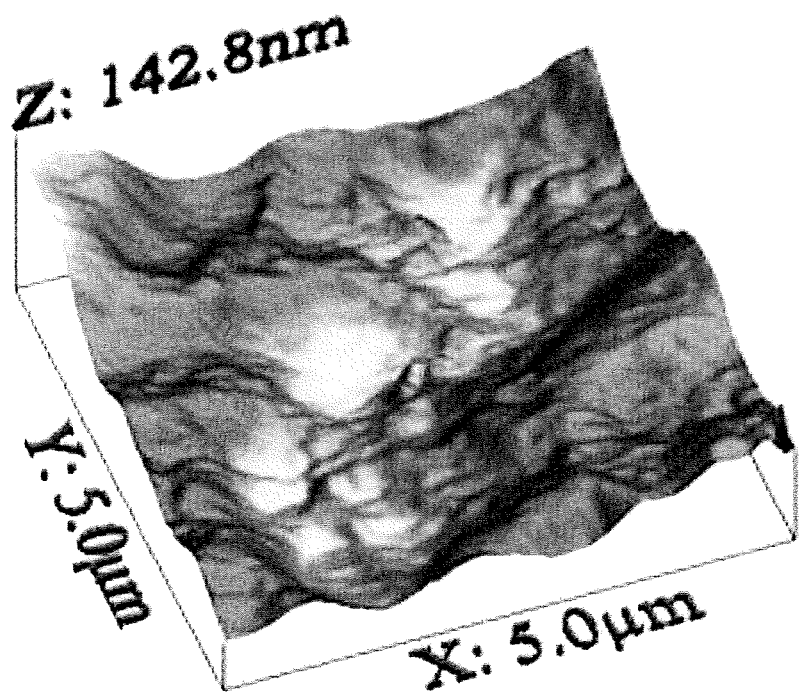
FIG. 37 is a 3D topography AFM micrograph image of a polycarbonate glass surface after immersion for 2 seconds in dichloromethane, exposure for 2 minutes to acetone vapors and coating with a TEOS/HMDS sol gel at 5 μm scale.
Figure 38:
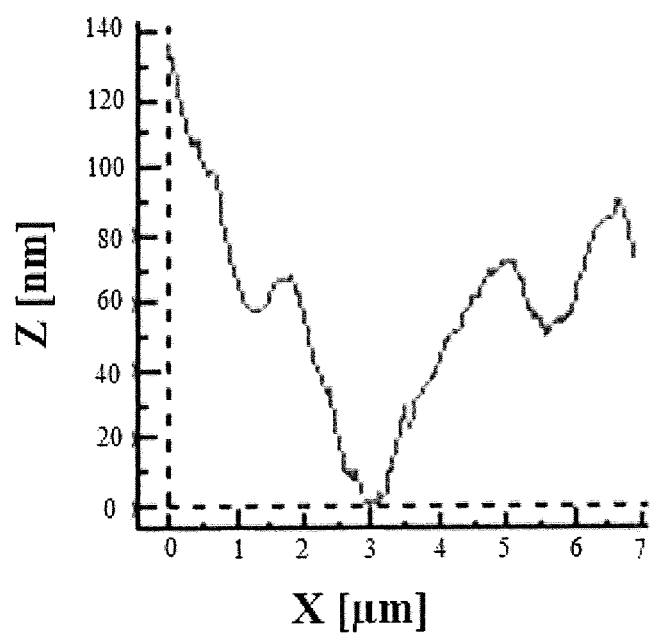
FIG. 38 is a line profile texture micrograph taken through an AFM micrograph of a polycarbonate glass surface after immersion for 2 seconds in dichloromethane, exposure for 2 minutes to acetone vapors and coating with a TEOS/HMDS sol gel at 5 μm scale.

Table 4 exhibits the effect of a sol gel coating upon the contact angles of the treated polycarbonates samples. FIG. 31 and FIG. 35 show the measurement of the contact angle for textured polycarbonate samples after immersion in dichloromethane for 2 seconds, subsequent exposure to pure acetone vapors for 1 minute and 2 minutes followed by coating with a TEOS/HMDS sol gel respectively. FIG. 32 shows the 2D topography AFM image of the polycarbonate after immersion for 2 seconds in dichloromethane, exposure for 1 minute to acetone vapors and coating with a TEOS/HMDS sol gel at 5 μm scale. FIG. 33 is the 3D topography AFM micrograph at 5 μm scale. FIG. 34 is the line profile texture micrograph taken through FIG. 33. FIG. 36 shows the 2D topography AFM image of the polycarbonate after immersion for 2 seconds in dichloromethane, exposure for 2 minutes to acetone vapors and coating with a TEOS/HMDS sol gel at 5 μm scale. FIG. 37 is the 3D topography AFM micrograph at 5 μm scale. FIG. 38 is the line profile texture micrograph taken through FIG. 37.

TABLE 4

Experimental parameter of solid-vapor interface method of preparing textured polycarbonate surfaces

| Sample | Average Contact Angle Before Coating | Average Contact Angle After Coating |
|---|---|---|
| $B_1$ | 79 | 135.8 |
| $B_2$ | 79.9 | 133.1 |

Figure 39:
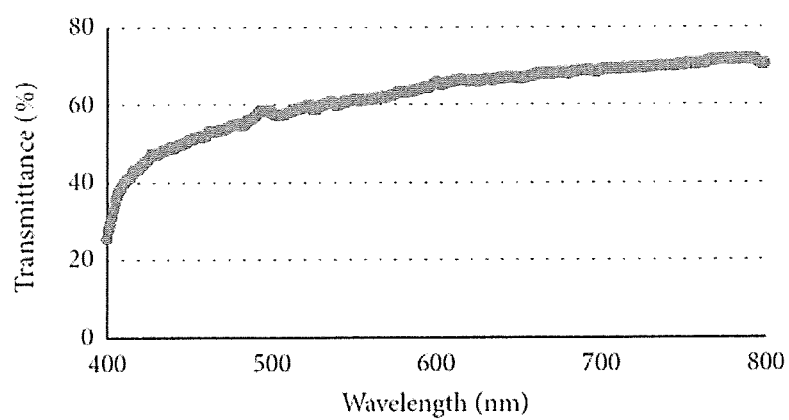
FIG. 39 shows the transmittance curve for a polycarbonate glass surface after immersion for 2 seconds in dichloromethane, exposure for 1 minute to acetone vapors and coating with a TEOS/HMDS.

The contact angles of the uncoated textured polycarbonate samples are increased significantly upon applying the hydrophobic TEOS/HMDS sol gel coating (135.8° for the $B_1$ coated sample). Furthermore, AFM micrographs show texturing on the surface and a tremendous increase in the RMS value (~179 nm) compared to counterpart uncoated polycarbonate B samples leading to an enhancement of hydrophobicity and a minor reduction in transmittance. The optical transmittance of the dichloromethane/acetone vapor/sol gel coated polycarbonate glass sample treated with acetone for 1 minute ($B_1$) was found to be approximately 40-70% (FIG. 39). Similarly for the $B_2$ sample the RMS value rose to 364 nm and lead to a high contact angle of 133.1° and only a slight reduction in transmittance from 23.67% to 16.85%. In conclusion, a facile two step method has been demonstrated by immersing polycarbonate materials in dichloromethane for ~2 s followed by exposure to acetone vapor at 33° C. for 1 minute and then sol gel coating. This resulted in a hierarchical superhydrophobic TEOS/HMDS gel coated surface having a contact angle of 135.8° and a transmittance of 50-70%. Hence, proper optimization of the spherules growth, dimensions, and interspherule distances and then sol gel coating resulted in a significantly hydrophobic polycarbonate surface. This approach is promising in developing future superhydrophobic, economic, and less technologically demanding surfaces for application as photovoltaic panels.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method of treating a glass surface comprising a polycarbonate, comprising:
    immersing the glass surface in liquid phase dichloromethane for about 2 seconds or less to form a treated glass surface comprising nanopores; and
    exposing the treated glass surface to vapor phase acetone for less than 4 minutes to form a textured glass surface with a hierarchical patterned nanoporous structure;
    wherein the textured glass surface has a higher surface hydrophobicity than the glass surface prior to the immersing, the exposing, or both; and
    wherein the textured glass surface has an optical light transmittance that is reduced by no more than 25 percentage points relative to the optical light transmittance of the polycarbonate glass surface prior to the immersing, the exposing, or both.

2. The method of claim 1, wherein the polycarbonate is produced from the precursor monomer bisphenol A.

3. The method of claim 1, wherein the immersing is performed for a time period of 1.0-2.0 seconds and the exposing is performed for a time period of 0.8-1.5 minutes.

4. The method of claim 1, wherein the treated glass surface comprises nanopores with an average diameter in the range of 100-800 nm and an average depth in the range of 2-15 nm.

5. The method of claim 1, wherein an average distance between the nanopores of the treated glass surface is in the range of 1-10 µm.

6. The method of claim 1, wherein the textured glass surface with a hierarchical patterned nanoporous structure comprises pores with an average diameter of 200-1000 nm and an average depth of 20-150 mm.

7. The method of claim 1, Wherein the textured glass surface with a hierarchical patterned nanoporous structure comprises spherules with an average width of 5-20 µm and an average height of 0.2-5 µm.

8. The method of claim 7, wherein the surface of the spherules is textured and comprises fibers with an average diameter of 200-600 nm and an average height of 20-200 nm.

9. The method of claim 1, wherein the textured glass surface has an average water droplet contact angle of greater 75°.

10. The method of claim 1, wherein the treated glass surface has an optical light transmittance of greater than 85% and the textured glass surface has an optical light transmittance of greater than 75%.

11. The method of claim 1, wherein the textured glass surface has a roughness root mean square value in the range of 100-500 nm.

12. The method of claim 1, wherein the exposing is performed for a time period of 1 minute or less.

13. A method of treating a glass surface comprising a polycarbonate, comprising:
    immersing the glass surface in a liquid phase polar aprotic solvent for less than 3 seconds to form a treated glass surface comprising nanopores;
    exposing the treated glass surface to a vapor phase polar aprotic solvent for less than 4 minutes to form a textured glass surface with a hierarchical patterned nanoporous structure, wherein the textured glass surface has a higher surface hydrophobicity than the glass surface prior to the immersing, the exposing, or both, and wherein the textured glass surface has an optical light transmittance that is reduced by no more than 25 percentage points relative to the optical light transmittance of the polycarbonate glass surface prior to the immersing, the exposing, or both; and
    dip coating the textured glass surface in a sol gel comprising 1,1,1,3,3,3-hexamethyl disilazane (HMDS) and tetraethyl orthosilicate (TEOS) to form a coated textured glass surface.

14. The method of claim 13, wherein the coated textured glass surface has an average water droplet contact angle of greater than 130°.

15. The method of claim 13, wherein the coated textured glass surface has an optical light transmittance of greater than 45%.

* * * * *